United States Patent
Heng et al.

(10) Patent No.: US 10,115,839 B2
(45) Date of Patent: *Oct. 30, 2018

(54) MODULE FABRICATION OF SOLAR CELLS WITH LOW RESISTIVITY ELECTRODES

(71) Applicant: SolarCity Corporation, San Mateo, CA (US)

(72) Inventors: Jiunn Benjamin Heng, Los Altos Hills, CA (US); Jianming Fu, Palo Alto, CA (US); Zheng Xu, Pleasanton, CA (US); Bobby Yang, Los Altos Hills, CA (US)

(73) Assignee: Tesla, Inc., Palo Alto, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 15/221,200

(22) Filed: Jul. 27, 2016

(65) Prior Publication Data

US 2016/0351727 A1   Dec. 1, 2016

Related U.S. Application Data

(63) Continuation of application No. 14/510,008, filed on Oct. 8, 2014, now Pat. No. 9,412,884, which is a
(Continued)

(51) Int. Cl.
*H01L 31/0224* (2006.01)
*H01L 31/05* (2014.01)
(Continued)

(52) U.S. Cl.
CPC ...... *H01L 31/0201* (2013.01); *H01L 31/0504* (2013.01); *H01L 31/0684* (2013.01);
(Continued)

(58) Field of Classification Search
CPC . H01L 31/0201; H01L 31/05; H01L 31/0504; H01L 31/0684
See application file for complete search history.

(56) References Cited

U.S. PATENT DOCUMENTS

| 819,360 A | 3/1902 | Mayer |
|---|---|---|
| 2,938,938 A | 5/1960 | Dickson |

(Continued)

FOREIGN PATENT DOCUMENTS

| CN | 1253381 | 5/2000 |
|---|---|---|
| CN | 1416179 | 10/2001 |

(Continued)

OTHER PUBLICATIONS

Electrically Conductive Foil Tape for Bus Bar Components in Photovoltaic Modules, Adhesives Research, http://www.adhesivesresearch.com/electrically-conductive-foil-tape-for-bus-bar-components-in-photovoltaic-modules/, accessed Oct. 12, 2017.
(Continued)

*Primary Examiner* — Susan D Leong
(74) *Attorney, Agent, or Firm* — Shun Yao; Park, Vaughan, Fleming & Dowler LLP

(57) ABSTRACT

One embodiment of the present invention provides a solar module. The solar module includes a front-side cover, a back-side cover, and a plurality of solar cells situated between the front- and back-side covers. A respective solar cell includes a multi-layer semiconductor structure, a front-side electrode situated above the multi-layer semiconductor structure, and a back-side electrode situated below the multi-layer semiconductor structure. Each of the front-side and the back-side electrodes comprises a metal grid. A respective metal grid comprises a plurality of finger lines and a single busbar coupled to the finger lines. The single busbar is configured to collect current from the finger lines.

20 Claims, 15 Drawing Sheets

Related U.S. Application Data continuation-in-part of application No. 14/153,608, filed on Jan. 13, 2014, now Pat. No. 9,219,174.

(60) Provisional application No. 61/751,733, filed on Jan. 11, 2013.

(51) Int. Cl.
    *H01L 31/068* (2012.01)
    *H01L 31/02* (2006.01)
    *H01L 31/0747* (2012.01)
    *H02S 40/30* (2014.01)
    *H02S 40/36* (2014.01)

(52) U.S. Cl.
    CPC .......... *H01L 31/0747* (2013.01); *H02S 40/30* (2014.12); *H02S 40/36* (2014.12); *Y02E 10/547* (2013.01)

(56) References Cited

U.S. PATENT DOCUMENTS

| | | |
|---|---|---|
| 3,094,439 A | 6/1963 | Harkness |
| 3,116,171 A | 12/1963 | Nielsen |
| 3,459,597 A | 8/1969 | Baron |
| 3,676,179 A | 7/1972 | Bokros |
| 3,961,997 A | 6/1976 | Chu |
| 3,969,163 A | 7/1976 | Wakefield |
| 4,015,280 A | 3/1977 | Matsushita et al. |
| 4,082,568 A | 4/1978 | Lindmayer |
| 4,124,410 A | 11/1978 | Kotval et al. |
| 4,124,455 A | 11/1978 | Lindmayer |
| 4,193,975 A | 3/1980 | Kotval et al. |
| 4,200,621 A | 4/1980 | Liaw et al. |
| 4,213,798 A | 7/1980 | Williams et al. |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder et al. |
| 4,342,044 A | 7/1982 | Ovshinsky et al. |
| 4,431,858 A | 2/1984 | Gonzalez et al. |
| 4,514,579 A | 4/1985 | Hanak |
| 4,540,843 A | 9/1985 | Gochermann et al. |
| 4,567,642 A | 2/1986 | Dilts et al. |
| 4,571,448 A | 2/1986 | Barnett |
| 4,577,051 A | 3/1986 | Hartman |
| 4,586,988 A | 5/1986 | Nath et al. |
| 4,589,191 A | 5/1986 | Green et al. |
| 4,612,409 A | 9/1986 | Hamakawa et al. |
| 4,617,421 A | 10/1986 | Nath |
| 4,633,033 A | 12/1986 | Nath et al. |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington et al. |
| 4,729,970 A | 3/1988 | Nath |
| 4,753,683 A | 6/1988 | Ellion |
| 4,771,017 A | 9/1988 | Tobin et al. |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | Von Campe |
| 5,057,163 A | 10/1991 | Barnett |
| 5,075,763 A | 12/1991 | Spitzer et al. |
| 5,084,107 A | 1/1992 | Deguchi |
| 5,118,361 A | 6/1992 | Fraas |
| 5,131,933 A | 7/1992 | Flodl et al. |
| 5,155,051 A | 10/1992 | Noguchi |
| 5,178,685 A | 1/1993 | Borenstein |
| 5,181,968 A | 1/1993 | Nath et al. |
| 5,213,628 A | 5/1993 | Noguchi et al. |
| 5,217,539 A | 6/1993 | Fraas et al. |
| 5,279,682 A | 1/1994 | Wald et al. |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi et al. |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo et al. |
| 5,676,766 A | 10/1997 | Probst et al. |
| 5,681,402 A | 10/1997 | Ichinose et al. |
| 5,698,451 A | 12/1997 | Hanoka |
| 5,705,828 A | 1/1998 | Noguchi et al. |
| 5,726,065 A | 3/1998 | Szlufcik et al. |
| 5,808,315 A | 9/1998 | Murakami |
| 5,814,195 A | 9/1998 | Lehan et al. |
| 5,903,382 A | 5/1999 | Tench et al. |
| 5,935,345 A | 8/1999 | Kuznicki |
| 6,017,581 A | 1/2000 | Hooker |
| 6,034,322 A | 3/2000 | Pollard |
| 6,091,019 A | 7/2000 | Sakata et al. |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan et al. |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,620,645 B2 | 3/2003 | Fraas |
| 6,552,414 B1 | 4/2003 | Horzel et al. |
| 6,586,270 B2 | 7/2003 | Tsuzuki et al. |
| 2,626,907 A1 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,761,771 B2 | 7/2004 | Satoh |
| 6,803,513 B2 | 10/2004 | Beernink |
| 6,841,051 B2 | 1/2005 | Crowley |
| 7,030,413 B2 | 4/2006 | Nakamura et al. |
| 7,128,975 B2 | 10/2006 | Inomata |
| 7,164,150 B2 | 1/2007 | Terakawa et al. |
| 7,328,534 B2 | 2/2008 | Dinwoodie |
| 7,388,146 B2 | 6/2008 | Fraas |
| 7,399,385 B2 | 7/2008 | German et al. |
| 7,534,632 B2 | 5/2009 | Hu et al. |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German et al. |
| 7,977,220 B2 | 7/2011 | Sanjurjo |
| 8,070,925 B2 | 12/2011 | Hoffman et al. |
| 8,115,093 B2 | 2/2012 | Gui |
| 8,119,901 B2 | 2/2012 | Jang |
| 8,152,536 B2 | 4/2012 | Scherer |
| 8,168,880 B2 | 5/2012 | Jacobs |
| 8,182,662 B2 | 5/2012 | Crowley |
| 8,209,920 B2 | 7/2012 | Krause et al. |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo et al. |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,219,174 B2 * | 12/2015 | Heng ............ H01L 31/0504 |
| 9,287,431 B2 | 3/2016 | Mascarenhas |
| 9,412,884 B2 * | 8/2016 | Heng ............ H01L 31/0504 |
| 9,761,744 B2 | 9/2017 | Wang |

(56) References Cited

U.S. PATENT DOCUMENTS

| | | |
|---|---|---|
| 2001/0008143 A1 | 7/2001 | Sasaoka et al. |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes et al. |
| 2003/0070705 A1 | 4/2003 | Hayden et al. |
| 2003/0097447 A1 | 5/2003 | Johnston |
| 2003/0116185 A1 | 6/2003 | Oswald |
| 2003/0118865 A1 | 6/2003 | Marks |
| 2003/0121228 A1 | 7/2003 | Stoehr et al. |
| 2003/0136440 A1 | 7/2003 | Machida |
| 2003/0168578 A1 | 9/2003 | Taguchi et al. |
| 2003/0183270 A1 | 10/2003 | Falk et al. |
| 2003/0201007 A1 | 10/2003 | Fraas |
| 2004/0035458 A1 | 2/2004 | Beernink |
| 2004/0065363 A1 | 4/2004 | Fetzer et al. |
| 2004/0103937 A1 | 6/2004 | Bilyalov et al. |
| 2004/0112419 A1 | 6/2004 | Boulanger |
| 2004/0112426 A1 | 6/2004 | Hagino |
| 2004/0123897 A1 | 7/2004 | Ojima et al. |
| 2004/0135979 A1 | 7/2004 | Hazelton |
| 2004/0152326 A1 | 8/2004 | Inomata |
| 2004/0185683 A1 | 9/2004 | Nakamura |
| 2005/0009319 A1 | 1/2005 | Abe |
| 2005/0012095 A1 | 1/2005 | Niira et al. |
| 2005/0022861 A1 | 1/2005 | Crowley |
| 2005/0022746 A1 | 2/2005 | Lampe |
| 2005/0061665 A1 | 3/2005 | Pavani |
| 2005/0062041 A1 | 3/2005 | Terakawa |
| 2005/0064247 A1 | 3/2005 | Sane |
| 2005/0074954 A1 | 4/2005 | Yamanaka |
| 2005/0109388 A1 | 5/2005 | Murakami et al. |
| 2005/0126622 A1 | 6/2005 | Mukai |
| 2005/0133084 A1 | 6/2005 | Joge et al. |
| 2005/0178662 A1 | 8/2005 | Wurczinger |
| 2005/0189015 A1 | 9/2005 | Rohatgi et al. |
| 2005/0199279 A1 | 9/2005 | Yoshimine et al. |
| 2005/0252544 A1 | 11/2005 | Rohatgi et al. |
| 2005/0257823 A1 | 11/2005 | Zwanenburg |
| 2005/0268963 A1 | 12/2005 | Jordan |
| 2006/0012000 A1 | 1/2006 | Estes et al. |
| 2006/0060238 A1 | 3/2006 | Hacke et al. |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach et al. |
| 2006/0231803 A1 | 10/2006 | Wang et al. |
| 2006/0255340 A1 | 11/2006 | Manivannan et al. |
| 2006/0260673 A1 | 11/2006 | Takeyama |
| 2006/0272698 A1 | 12/2006 | Durvasula |
| 2006/0283496 A1 | 12/2006 | Okamoto et al. |
| 2006/0283499 A1 | 12/2006 | Terakawa et al. |
| 2007/0023081 A1 | 2/2007 | Johnson et al. |
| 2007/0023082 A1 | 2/2007 | Manivannan et al. |
| 2007/0108437 A1 | 5/2007 | Tavkhelidze |
| 2007/0110975 A1 | 5/2007 | Schneweis |
| 2007/0132034 A1 | 6/2007 | Curello et al. |
| 2007/0137699 A1 | 6/2007 | Manivannan et al. |
| 2007/0148336 A1 | 6/2007 | Bachrach et al. |
| 2007/0186853 A1 | 8/2007 | Gurary |
| 2007/0186968 A1 | 8/2007 | Nakauchi |
| 2007/0186970 A1 | 8/2007 | Takahashi et al. |
| 2007/0187652 A1 | 8/2007 | Konno |
| 2007/0202029 A1 | 8/2007 | Burns et al. |
| 2007/0235077 A1 | 10/2007 | Nagata |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann et al. |
| 2007/0283997 A1 | 12/2007 | Hachtmann |
| 2008/0011350 A1 | 1/2008 | Luch |
| 2008/0035489 A1 | 2/2008 | Allardyce |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar et al. |
| 2008/0053519 A1 | 3/2008 | Pearce |
| 2008/0053522 A1* | 3/2008 | Basol .................. H01L 31/0749 |
| | | 136/256 |
| 2008/0061293 A1 | 3/2008 | Ribeyron |
| 2008/0092947 A1 | 4/2008 | Lopatin et al. |
| 2008/0121272 A1 | 5/2008 | Besser et al. |
| 2008/0121276 A1 | 5/2008 | Lopatin et al. |
| 2008/0121932 A1 | 5/2008 | Ranade |
| 2008/0128017 A1 | 6/2008 | Ford |
| 2008/0149161 A1 | 6/2008 | Nishida et al. |
| 2008/0149163 A1 | 6/2008 | Gangemi |
| 2008/0156370 A1 | 7/2008 | Abdallah et al. |
| 2008/0173347 A1 | 7/2008 | Korevaar |
| 2008/0173350 A1 | 7/2008 | Choi et al. |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness et al. |
| 2008/0223439 A1 | 9/2008 | Deng |
| 2008/0230122 A1 | 9/2008 | Terakawa |
| 2008/0251114 A1 | 10/2008 | Tanaka |
| 2008/0251117 A1 | 10/2008 | Schubert et al. |
| 2008/0264477 A1 | 10/2008 | Moslehi |
| 2008/0276983 A1 | 11/2008 | Drake et al. |
| 2008/0283115 A1 | 11/2008 | Fukawa et al. |
| 2008/0302030 A1 | 12/2008 | Stancel et al. |
| 2008/0303503 A1 | 12/2008 | Wolfs |
| 2008/0308145 A1 | 12/2008 | Krasnov et al. |
| 2009/0007965 A1 | 1/2009 | Rohatgi et al. |
| 2009/0014055 A1 | 1/2009 | Beck |
| 2009/0056805 A1 | 3/2009 | Barnett |
| 2009/0065043 A1 | 3/2009 | Hadorn |
| 2009/0078318 A1 | 3/2009 | Meyers et al. |
| 2009/0084439 A1 | 4/2009 | Lu et al. |
| 2009/0101872 A1 | 4/2009 | Young et al. |
| 2009/0120492 A1 | 5/2009 | Sinha |
| 2009/0139512 A1 | 6/2009 | Lima |
| 2009/0151771 A1 | 6/2009 | Kothari |
| 2009/0151783 A1 | 6/2009 | Lu et al. |
| 2009/0155028 A1 | 6/2009 | Boguslavskiy |
| 2009/0188561 A1 | 7/2009 | Aiken et al. |
| 2009/0194233 A1 | 8/2009 | Tamura |
| 2009/0221111 A1 | 9/2009 | Frolov et al. |
| 2009/0229854 A1 | 9/2009 | Fredenberg |
| 2009/0239331 A1 | 9/2009 | Xu et al. |
| 2009/0250108 A1 | 10/2009 | Zhou et al. |
| 2009/0255574 A1 | 10/2009 | Yu et al. |
| 2009/0272419 A1 | 11/2009 | Sakamoto |
| 2009/0283138 A1 | 11/2009 | Lin et al. |
| 2009/0283145 A1 | 11/2009 | Kim et al. |
| 2009/0293948 A1 | 12/2009 | Tucci et al. |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman et al. |
| 2010/0043863 A1 | 2/2010 | Wudu |
| 2010/0065111 A1 | 3/2010 | Fu et al. |
| 2010/0068890 A1 | 3/2010 | Stockum et al. |
| 2010/0084009 A1 | 4/2010 | Carlson |
| 2010/0108134 A1 | 5/2010 | Ravi |
| 2010/0116325 A1 | 5/2010 | Nikoonahad |
| 2010/0124619 A1 | 5/2010 | Xu et al. |
| 2010/0131108 A1 | 5/2010 | Meyer |
| 2010/0132774 A1 | 6/2010 | Borden |
| 2010/0132792 A1 | 6/2010 | Kim et al. |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |

(56) References Cited

U.S. PATENT DOCUMENTS

| | | |
|---|---|---|
| 2010/0218799 A1 | 9/2010 | Stefani |
| 2010/0224230 A1 | 9/2010 | Luch et al. |
| 2010/0229914 A1 | 9/2010 | Adriani |
| 2010/0236612 A1 | 9/2010 | Khajehoddin |
| 2010/0240172 A1 | 9/2010 | Rana |
| 2010/0243021 A1 | 9/2010 | Lee |
| 2010/0269904 A1 | 10/2010 | Cousins |
| 2010/0279492 A1 | 11/2010 | Yang |
| 2010/0300506 A1 | 12/2010 | Heng et al. |
| 2010/0300507 A1 | 12/2010 | Heng et al. |
| 2010/0300525 A1 | 12/2010 | Lim |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0023958 A1 | 2/2011 | Masson |
| 2011/0030777 A1 | 2/2011 | Lim |
| 2011/0048491 A1 | 3/2011 | Taira |
| 2011/0088762 A1 | 4/2011 | Singh |
| 2011/0120518 A1 | 5/2011 | Rust |
| 2011/0146759 A1 | 6/2011 | Lee |
| 2011/0146781 A1 | 6/2011 | Laudisio et al. |
| 2011/0156188 A1 | 6/2011 | Tu |
| 2011/0168250 A1 | 7/2011 | Lin et al. |
| 2011/0168261 A1 | 7/2011 | Welser |
| 2011/0174374 A1 | 7/2011 | Harder |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng et al. |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch et al. |
| 2011/0308573 A1 | 12/2011 | Jaus |
| 2012/0000502 A1 | 1/2012 | Wiedeman |
| 2012/0012153 A1 | 1/2012 | Azechi |
| 2012/0012174 A1 | 1/2012 | Wu |
| 2012/0028461 A1 | 2/2012 | Ritchie et al. |
| 2012/0031480 A1 | 2/2012 | Tisler |
| 2012/0040487 A1 | 2/2012 | Asthana |
| 2012/0042925 A1 | 2/2012 | Pfennig |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Beitel et al. |
| 2012/0122262 A1 | 5/2012 | Kang |
| 2012/0125391 A1 | 5/2012 | Pinarbasi |
| 2012/0152349 A1 | 6/2012 | Cao |
| 2012/0152752 A1 | 6/2012 | Keigler |
| 2012/0167986 A1 | 7/2012 | Meakin |
| 2012/0192932 A1 | 8/2012 | Wu et al. |
| 2012/0199184 A1 | 8/2012 | Nie |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng et al. |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0019919 A1 | 1/2013 | Hoang |
| 2013/0056051 A1 | 3/2013 | Jin |
| 2013/0096710 A1 | 4/2013 | Pinarbasi |
| 2013/0112239 A1 | 5/2013 | Liptac |
| 2013/0152996 A1 | 6/2013 | DeGroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2013/0306128 A1 | 11/2013 | Kannou |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0120699 A1 | 5/2014 | Hua |
| 2014/0124013 A1 | 5/2014 | Morad et al. |
| 2014/0124014 A1 | 5/2014 | Morad et al. |
| 2014/0154836 A1 | 6/2014 | Kim |
| 2014/0196768 A1 | 7/2014 | Heng et al. |
| 2014/0242746 A1 | 8/2014 | Albadri |
| 2014/0261624 A1 | 9/2014 | Cruz-Campa |
| 2014/0299187 A1 | 10/2014 | Chang |
| 2014/0318611 A1 | 10/2014 | Moslehi |
| 2014/0345674 A1 | 11/2014 | Yang et al. |
| 2014/0349441 A1 | 11/2014 | Fu |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0144180 A1 | 5/2015 | Baccini |
| 2015/0171230 A1 | 6/2015 | Kapur |
| 2015/0214409 A1 | 7/2015 | Pfeiffer |
| 2015/0236177 A1 | 8/2015 | Fu |
| 2015/0270410 A1 | 9/2015 | Heng |
| 2015/0280641 A1 | 10/2015 | Garg |
| 2015/0340531 A1 | 11/2015 | Hayashi |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0163888 A1 | 6/2016 | Reddy |
| 2016/0190354 A1 | 6/2016 | Agrawal |
| 2016/0204289 A1 | 7/2016 | Tao |
| 2016/0322513 A1 | 11/2016 | Martin |
| 2016/0329443 A1 | 11/2016 | Wang |
| 2017/0084766 A1 | 3/2017 | Yang |
| 2017/0222082 A1 | 8/2017 | Lin |

FOREIGN PATENT DOCUMENTS

| | | |
|---|---|---|
| CN | 101233620 | 7/2008 |
| CN | 101553933 | 10/2009 |
| CN | 102012010151 | 1/2010 |
| CN | 101305454 | 5/2010 |
| CN | 102088040 | 6/2011 |
| CN | 102263157 | 11/2011 |
| CN | 104205347 | 12/2014 |
| CN | 2626907 A1 | 3/2015 |
| DE | 4030713 | 4/1992 |
| DE | 102006009194 | 8/2007 |
| DE | 202007002897 | 8/2008 |
| DE | 102008045522 | 3/2010 |
| DE | 102010061317 | 6/2012 |

(56) References Cited

FOREIGN PATENT DOCUMENTS

| | | |
|---|---|---|
| DE | 10201201051 | 11/2013 |
| DE | H04245683 A | 11/2013 |
| EP | 1770791 | 4/2007 |
| EP | 1816684 | 8/2007 |
| EP | 2071635 | 6/2009 |
| EP | 2113946 | 11/2009 |
| EP | 2362430 | 8/2011 |
| EP | 2385561 | 11/2011 |
| EP | 2387079 | 11/2011 |
| EP | 2002057357 A | 11/2011 |
| EP | 2011123646 A2 | 7/2012 |
| EP | 2479796 A1 | 8/2013 |
| EP | 2479796 | 7/2015 |
| EP | 2626907 | 8/2015 |
| JP | 5789269 | 6/1982 |
| JP | 2011008881 A2 | 9/1992 |
| JP | 06196766 | 7/1994 |
| JP | 2385561 A2 | 9/1995 |
| JP | 10004204 | 1/1998 |
| JP | H1131834 | 2/1999 |
| JP | 2000164902 | 6/2000 |
| JP | 2010085949 | 2/2002 |
| JP | 20050122721 A | 6/2005 |
| JP | 2006523025 | 10/2006 |
| JP | 2006324504 | 11/2006 |
| JP | 2007123792 | 5/2007 |
| JP | 2008135655 | 6/2008 |
| JP | 2009054748 | 3/2009 |
| JP | 2009177225 | 8/2009 |
| JP | 2011181966 | 9/2011 |
| JP | 2012119393 | 6/2012 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 2003083953 A1 | 12/2005 |
| KR | 2005159312 A | 1/2006 |
| KR | 2006097189 A1 | 2/2009 |
| WO | 9120097 A1 | 11/1991 |
| WO | 2011005447 A2 | 12/1991 |
| WO | 1991017839 | 10/2003 |
| WO | 20060003277 A | 9/2006 |
| WO | 2008089657 | 7/2008 |
| WO | 2009094578 | 7/2009 |
| WO | 2009150654 | 12/2009 |
| WO | 20090011519 A | 12/2009 |
| WO | 2010070015 | 6/2010 |
| WO | 2009150654 A2 | 7/2010 |
| WO | 2010075606 | 7/2010 |
| WO | H07249788 A | 8/2010 |
| WO | 2010075606 A1 | 9/2010 |
| WO | 100580957 C | 10/2010 |
| WO | 2010123974 | 10/2010 |
| WO | 2010104726 A2 | 1/2011 |
| WO | 2010123974 A1 | 1/2011 |
| WO | 2011005447 | 1/2011 |
| WO | 2011008881 | 1/2011 |
| WO | 2011053006 | 5/2011 |
| WO | 104409402 | 10/2011 |
| WO | 2013020590 | 2/2013 |
| WO | 2013020590 A1 | 2/2013 |
| WO | 2013046351 | 4/2013 |
| WO | 2014066265 | 5/2014 |
| WO | 2014074826 | 5/2014 |
| WO | 2014110520 | 7/2014 |
| WO | 2014117138 | 7/2014 |
| WO | 2015183827 | 12/2015 |
| WO | 2016090332 | 6/2016 |

OTHER PUBLICATIONS

Geissbuhler et al., Silicon Heterojunction solar Cells with Copper-Plated Grid Electrodes: Status and Comparison with Silver Thick-Film Techniques, IEEE Journal of Photovoltaics, vol. 4, No. 4, Jul. 2014.
Meyerson et al. "Nonequilibrium boron doping effects in low-temperature epitaxial silicon", Appl. Phys. Lett. 50 (2), p. 113 (1987).
Li, "Surface and Bulk Passsivation of Multicrystalline Silicon Solar Cells by Silicon Nitride (H) Layer: Modeling and Experiments", Ph.D. dissertation, N.J. Inst. of Tech., Jan. 2009.
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.
L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.
Jianhua Zhao et al. "24% Efficient pert silicon solar cell: Recent improvements in high efficiency silicon cell research".
"Nonequilibrium boron doping effects in low-temperature epitaxial silicon" Meyerson et al., Appl. Phys. Lett. 50 (2), p. 113 (1987).
"Doping Diffusion and Implantation" Parthavi, <http://www.leb.eei.uni-erlangen.de/winterakademie/2010/report/content/course03/pdf/0306.pdf>.
Chabal, Yves J. et al., 'Silicon Surface and Interface Issues for Nanoelectronics,' The Electrochemical Society Interface, Spring 2005, pp. 31-33.
Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20I.pptx> and converted to PDF.
Davies, P.C.W., 'Quantum tunneling time,' Am. J. Phys. 73, Jan. 2005, pp. 23-27.
Green, Martin A. et al., 'High-Efficiency Silicon Solar Cells,' IEEE Transactions on Electron Devices, vol. ED-31, No. 5, May 1984, pp. 679-683.
Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.
Yao Wen-Jie et al: 'Interdisciplinary Physics and Related Areas of Science and Technology; The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.
WP Leroy et al., "In Search for the Limits of Rotating Cylindrical Magnetron Sputtering", Magnetron, ION Processing and ARC Technologies European Conference, Jun. 18, 2010, pp. 1-32.
Beaucarne G et al: 'Epitaxial thin-film Si solar cells' Thin Solid Films, Elsevier-Sequoia S.A. Lausanne, CH LNKD- DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].
Collins English Dictionary (Convex. (2000). In Collins English Dictionary. http://search.credoreference.com/content/entry/hcengdict/convex/0 on Oct. 18, 2014).
Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.
Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.
JCS Pires, J Otubo, AFB Braga, PR Mei; The purification of metallurgical grade silicon by electron beam melting, J of Mats Process Tech 169 (2005) 16-20.

(56) References Cited

OTHER PUBLICATIONS

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.

Merriam-Webster online dictionary—"mesh". (accessed Oct. 8, 2012).

Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.

Mueller, Thomas, et al. "High quality passivation for heterojunction solar cells by hydrogenated amorphous silicon suboxide films." Applied Physics Letters 92.3 (2008): 033504-033504.

Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).

O'Mara, W.C.; Herring, R.B.; Hunt L.P. (1990). Handbook of Semiconductor Silicon Technology. William Andrew Publishing/Noyes. pp. 275-293.

Stangl et al., Amorphous/Crystalline Silicon heterojunction solar cells—a simulation study; 17th European Photovoltaic Conference, Munich, Oct. 2001.

Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.

Parthavi, "Doping by Diffusion and Implantation", <http://www.leb.eei.uni-erlangen.de/winterakademie/2010/report/course03/pdf/0306.pdf>.

Weiss, "Development of different copper seed layers with respect to the copper electroplating process," Microelectronic Engineering 50 (2000) 443-440, Mar. 15, 2000.

Tomasi, "Back-contacted Silicon Heterojunction Solar Cells With Efficiency>21%" 2014 IEEE.

Hornbachner et al., "Cambered Photovoltaic Module and Method for its Manufacture" Jun. 17, 2009.

Machine translation of JP 10004204 A, Shindou et al.

\* cited by examiner

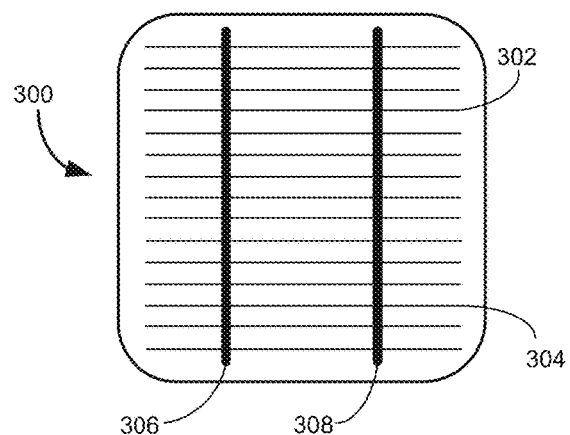
FIG. 3A (PRIOR ART)
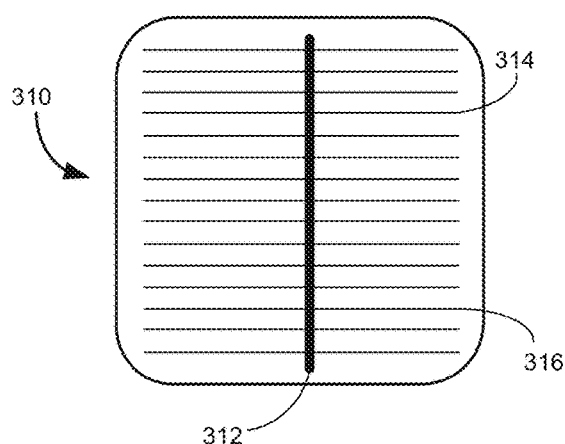 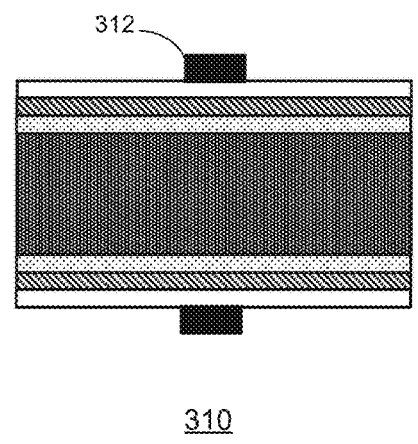
FIG. 3B FIG. 3C

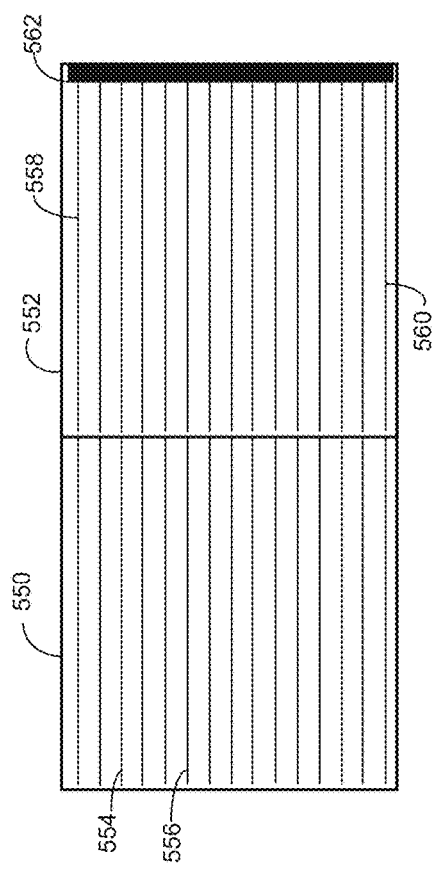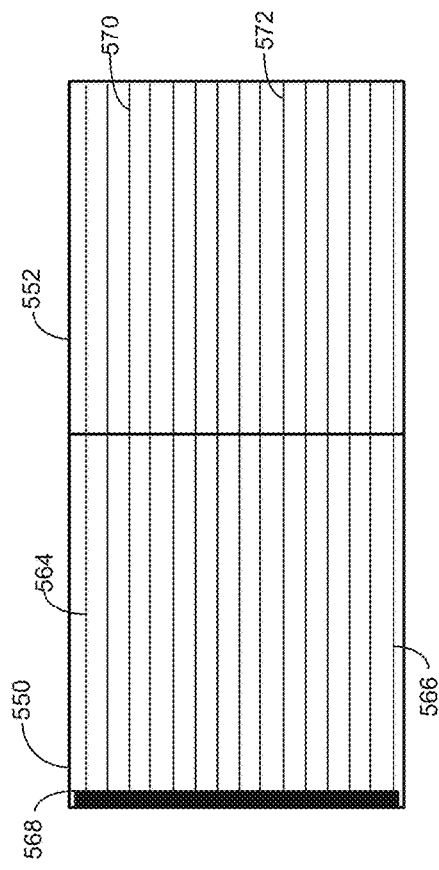

| Power Loss (%) due to Rs | Ribbon Thickness | | | |
|---|---|---|---|---|
| Model Type | 200um | 250um | 300um | 400um |
| 5inch DBB 96cell | 1.30% | 1.09% | 0.95% | 0.77% |
| 5inch SBB 96cell | 2.34% | 1.92% | 1.64% | 1.30% |
| 6inch DBB 60cell | 2.82% | 2.34% | 2.02% | 1.62% |
| 6inch SBB 60cell | 5.20% | 4.25% | 3.61% | 2.82% |
| 6inch DBB 72cell | 2.79% | 2.31% | 1.98% | 1.58% |
| 6inch SBB 72cell | 5.22% | 4.25% | 3.60% | 2.79% |

FIG. 6A

| Power Loss (%) due to Rs | Ribbon Thickness | | | | Tab thickness |
|---|---|---|---|---|---|
| Model Type | 200um | 250um | 300um | 400um | 250um |
| 5inch SBB 96cell | 2.34% | 1.92% | 1.64% | 1.30% | 0.73% |
| 6inch SBB 60cell | 5.20% | 4.25% | 3.61% | 2.82% | 1.64% |
| 6inch SBB 72cell | 5.22% | 4.25% | 3.60% | 2.73% | 1.55% |

FIG. 6B

MODULE FABRICATION OF SOLAR CELLS WITH LOW RESISTIVITY ELECTRODES

RELATED APPLICATION

This application is a continuation of U.S. patent application Ser. No. 14/510,008, entitled "MODULE FABRICATION OF SOLAR CELLS WITH LOW RESISTIVITY ELECTRODES," by inventors Jiunn Benjamin Heng, Jianming Fu, Zheng Xu, and Bobby Yang, filed 8 Oct. 2014, which is a continuation-in-part application of U.S. patent application Ser. No. 14/153,608, entitled "MODULE FABRICATION OF SOLAR CELLS WITH LOW RESISTIVITY ELECTRODES," by inventors Jiunn Benjamin Heng, Jianming Fu, Zheng Xu, and Bobby Yang, filed 13 Jan. 2014, which claims the benefit of U.S. Provisional Application No. 61/751,733, entitled "Module Fabrication Using Bifacial Tunneling Junction Solar Cells with Copper Electrodes," by inventors Jiunn Benjamin Heng, Jianming Fu, Zheng Xu, and Bobby Yang, filed 11 Jan. 2013, the disclosures of which are incorporated by reference in their entirety herein.

BACKGROUND

Field

This disclosure is generally related to the fabrication of solar cells. More specifically, this disclosure is related to module fabrication of bifacial tunneling junction solar cells.

Related Art

The negative environmental impact of fossil fuels and their rising cost have resulted in a dire need for cleaner, cheaper alternative energy sources. Among different forms of alternative energy sources, solar power has been favored for its cleanness and wide availability.

A solar cell converts light into electricity using the photovoltaic effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal band gaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi-junction structure includes multiple single-junction structures of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

FIG. 1 presents a diagram illustrating an exemplary solar cell (prior art). Solar cell 100 includes an n-type doped Si substrate 102, a p+ silicon emitter layer 104, a front electrode grid 106, and an Al back electrode 108. Arrows in FIG. 1 indicate incident sunlight. As one can see from FIG. 1, Al back electrode 108 covers the entire backside of solar cell 100, hence preventing light absorption at the backside. Moreover, front electrode grid 106 often includes a metal grid that is opaque to sunlight, and casts a shadow on the front surface of solar cell 100. For a conventional solar cell, the front electrode grid can block up to 8% of the incident sunlight, thus significantly reducing the conversion efficiency.

SUMMARY

One embodiment of the present invention provides a solar module. The solar module includes a front-side cover, a back-side cover, and a plurality of solar cells situated between the front- and back-side covers. A respective solar cell includes a multi-layer semiconductor structure, a front-side electrode situated above the multi-layer semiconductor structure, and a back-side electrode situated below the multi-layer semiconductor structure. Each of the front-side and the back-side electrodes comprises a metal grid. A respective metal grid comprises a plurality of finger lines and a single busbar coupled to the finger lines. The single busbar is configured to collect current from the finger lines.

In a variation on the embodiment, the single busbar is located at a center of a respective surface of the solar cell.

In a further variation, two adjacent solar cells are strung together by a stringing ribbon woven from a front surface of a solar cell to a back surface of an adjacent solar cell. The stringing ribbon is soldered to single busbars on the front and the back surfaces, and a width of the stringing ribbon is substantially similar to a width of the single busbar.

In a variation on the embodiment, single busbars of a front and a back surface of the solar cell are located at opposite edges.

In a further variation, two adjacent solar cells are coupled together by a metal tab soldered to a first single busbar at an edge of a solar cell and a second single busbar at an adjacent edge of the adjacent solar cell. A width of the metal tab is substantially similar to a length of the first and the second single busbar.

In a further variation, the first single busbar is on the front surface of the solar cell, and the second single busbar is on the back surface of the adjacent solar cell.

In a further variation, the first single busbar and the second single busbar are on the same side of surface of the two solar cells.

In a further variation, a plurality of solar cells are coupled by metal tabs into a string, and wherein a plurality of strings are coupled electrically in series or in parallel In a further variation, a length of the metal tab is between 3 and 12 mm.

In a further variation, two adjacent solar cells are coupled together by overlapping edges of the two adjacent solar cells. The edges of the two adjacent solar cells are overlapped in such a way that a top edge busbar of a first solar cell is coupled to a bottom edge busbar of a second adjacent solar cell, thereby facilitating a serial electrical connection between the two adjacent solar cells.

In a further variation, a plurality of solar cells are coupled by overlapping edges to form a string, and wherein a plurality of strings are coupled electrically in series or in parallel.

In a variation on the embodiment, the multi-layer semiconductor structure includes a base layer, a front- or back-side emitter, and a back or front surface field layer.

In a further variation, the multi-layer semiconductor structure further includes a quantum tunneling barrier (QTB) layer situated at both sides of the base layer.

In a variation on the embodiment, the metal grid comprises at least an electroplated Cu layer.

In a variation on the embodiment, a width of the single busbar is between 0.5 and 3 mm.

In a variation on the embodiment, the solar module further includes a plurality of maximum power point tracking (MPPT) devices. A respective MPPT device is coupled to an individual solar cell, thereby facilitating cell-level MPPT.

In a further variation, the solar module further includes a plurality of MPPT devices, wherein a respective MPPT device is coupled to a string of solar cells, thereby facilitating string-level MPPT.

In a variation on the embodiment, the front-side and the back-side covers are transparent to facilitate bifacial configuration of the solar module.

In a variation on the embodiment, the plurality of solar cells includes at least one of: a 5-inch solar cell, a 6-inch solar cell, and a ⅛, ⅙, ¼, ⅓, or ½ of a 5-inch or a 6-inch solar cell.

One embodiment of the present invention provides a solar cell coupling system. The system includes a first solar cell and a second solar cell. A respective solar cell comprises a front-side electrode and a back-side electrode. A respective electrode comprises a plurality of finger lines and a single busbar coupled to the finger lines, the bus bar being situated at the edge of the respective solar cell. The system further includes a metal tab coupling the front-side electrode of the first solar cell and the back-side electrode of the second solar cell.

One embodiment of the present invention provides a solar cell coupling system. The system includes a first solar cell and a second solar cell. A respective solar cell comprises a front-side electrode and a back-side electrode. A respective electrode comprises a plurality of finger lines and a single busbar coupled to the finger lines, the bus bar being situated at the edge of the respective solar cell. An edge of the first solar cell overlaps with an edge of the second solar cell such that the busbar of the front-side electrode of the first solar cell is coupled to the busbar of the back-side electrode of the second solar cell.

BRIEF DESCRIPTION OF THE FIGURES

FIG. 3A presents a diagram illustrating the electrode grid of a conventional solar cell (prior art).

FIG. 3B presents a diagram illustrating the front or back surface of an exemplary bifacial solar cell with a single center busbar per surface, in accordance with an embodiment of the present invention.

FIG. 3C presents a diagram illustrating a cross-sectional view of the bifacial solar cell with a single center busbar per surface, in accordance with an embodiment of the present invention.

FIG. 5H presents a diagram illustrating the top-view of two adjacent edge-overlapped solar cells, in accordance with an embodiment of the present invention.

FIG. 5I presents a diagram illustrating the bottom-view of two adjacent edge-overlapped solar cells, in accordance with an embodiment of the present invention

FIG. 6A presents a diagram illustrating the percentages of the ribbon-resistance-based power loss for the double busbar (DBB) and the single busbar (SBB) configurations for different types of cells, different ribbon thicknesses, and different panel configurations.

FIG. 6B presents a diagram comparing the power loss difference between the stringing ribbons and the single tab for different ribbon/tab thicknesses.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a high-efficiency solar module. The solar module includes a bifacial tunneling junction solar cell with electroplated Cu gridlines serving as front- and back-side electrodes. To reduce shading and cost, a single Cu busbar or tab is used to collect current from the Cu fingers. In some embodiments, the single busbar or tab is placed in the center of the front and backsides of the solar cell. To further reduce shading, in some embodiments, the single Cu busbar or tab is placed on the opposite edges of the front and backside of a solar cell. Both the fingers and the busbars can be fabricated using a technology for producing shade-free electrodes. In addition, the fingers and busbars can include high-aspect ratio Cu gridlines to ensure low resistivity. When multiple solar cells are stringed or tabbed together to form a solar panel, conventional stringing/tabbing processes are modified based on the locations of the busbars. Compared with conventional solar modules based on monofacial, double-busbar solar cells, embodiments of the present invention provide solar modules with up to an 18% gain in power. Moreover, 30% of the power that may be lost due to a partially shaded solar panel can be recouped by applying maximum power point tracking (MPPT) technology at the cell level. In some embodiments, each solar cell within a solar panel is coupled to an MPPT integrated circuit (IC) chip.

Bifacial Tunneling Junction Solar Cells

Figure 1:
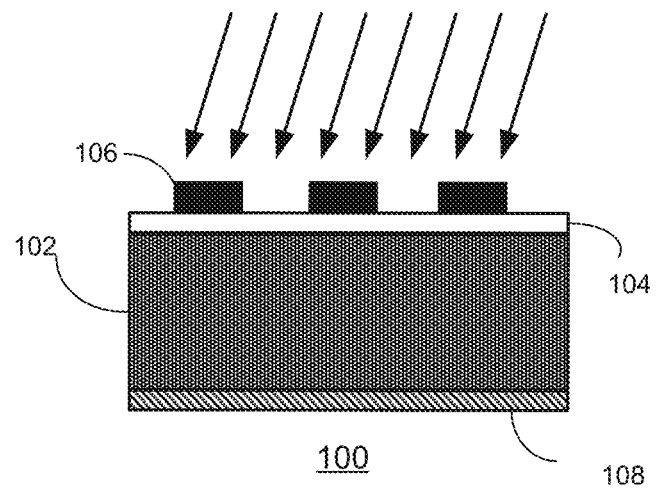
FIG. 1 presents a diagram illustrating an exemplary solar cell (prior art).
Figure 2:
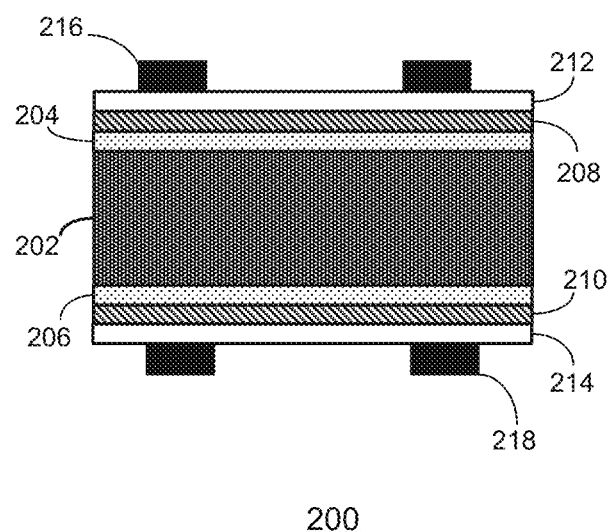
FIG. 2 presents a diagram illustrating an exemplary double-sided tunneling junction solar cell, in accordance with an embodiment of the present invention.

FIG. 2 presents a diagram illustrating an exemplary double-sided tunneling junction solar cell, in accordance with an embodiment of the present invention. Double-sided tunneling junction solar cell 200 includes a substrate 202, quantum tunneling barrier (QTB) layers 204 and 206 covering both surfaces of substrate 202 and passivating the surface-defect states, a front-side doped a-Si layer forming a front emitter 208, a back-side doped a-Si layer forming a BSF layer 210, a front transparent conducting oxide (TCO) layer 212, a back TCO layer 214, a front metal grid 216, and a back metal grid 218. Note that it is also possible to have the emitter layer at the backside and a front surface field (FSF) layer at the front side of the solar cell. Details, including fabrication methods, about double-sided tunneling junction solar cell 200 can be found in U.S. patent application Ser. No. 12/945,792, entitled "Solar Cell with Oxide Tunneling Junctions," by inventors Jiunn Benjamin Heng, Chentao Yu, Zheng Xu, and Jianming Fu, filed 12 Nov. 2010, the disclosure of which is incorporated by reference in its entirety herein.

As one can see from FIG. 2, the symmetric structure of double-sided tunneling junction solar cell 200 ensures that double-sided tunneling junction solar cell 200 can be bifacial given that the backside is exposed to light. In solar cells, the metallic contacts, such as front and back metal grids 216 and 218, are necessary to collect the current generated by the solar cell. In general, a metal grid includes two types of metal lines, including busbars and fingers. More specifically, busbars are wider metal strips that are connected directly to external leads (such as metal tabs), while fingers are finer areas of metalization which collect current for delivery to the busbars. The key design trade-off in the metal grid design is the balance between the increased resistive losses associated with a widely spaced grid and the increased reflection and shading effect caused by a high fraction of metal coverage of the surface. In conventional solar cells, to prevent power loss due to series resistance of the fingers, at least two busbars are placed on the surface of the solar cell to collect current from the fingers, as shown in FIG. 3A. For standardized 5-inch solar cells (which can be 5×5 inch$^2$ squares or pseudo squares with rounded corners), typically there are two busbars at each surface. For larger, 6-inch solar cells (which can be 5×5 inch$^2$ squares or pseudo squares with rounded corners), three or more busbars may be needed depending on the resistivity of the electrode materials. Note that in FIG. 3A a surface (which can be the front or back surface) of solar cell 300 includes a plurality of parallel finger lines, such as finger lines 302 and 304; and two busbars 306 and 308 placed perpendicular to the finger lines. Note that the busbars are placed in such a way as to ensure that the distance (and hence the resistance) from any point on a finger to a busbar is small enough to minimize power loss. However, these two busbars and the metal ribbons that are later soldered onto these busbars for inter-cell connections can create a significant amount of shading, which degrades the solar cell performance.

In some embodiments of the present invention, the front and back metal grids, such as the finger lines, can include electroplated Cu lines, which have reduced resistance compared with conventional Ag grids. For example, using an electroplating or electroless plating technique, one can obtain Cu grid lines with a resistivity of equal to or less than $5 \times 10^{-6}$ Ω·cm. Details about an electroplated Cu grid can be found in U.S. patent application Ser. No. 12/835,670, entitled "Solar Cell with Metal Grid Fabricated by Electroplating," by inventors Jianming Fu, Zheng Xu, Chentao Yu, and Jiunn Benjamin Heng, filed 13 Jul. 2010; and U.S. patent application Ser. No. 13/220,532, entitled "Solar Cell with Electroplated Metal Grid," by inventors Jianming Fu, Jiunn Benjamin Heng, Zheng Xu, and Chentao Yu, filed 29 Aug. 2011, the disclosures of which are incorporated by reference in their entirety herein.

The reduced resistance of the Cu fingers makes it possible to have a metal grid design that maximizes the overall solar cell efficiency by reducing the number of busbars on the solar cell surface. In some embodiments of the present invention, a single busbar is used to collect finger current. The power loss caused by the increased distance from the fingers to the busbar can be balanced by the reduced shading.

FIG. 3B presents a diagram illustrating the front or back surface of an exemplary bifacial solar cell with a single center busbar per surface, in accordance with an embodiment of the present invention. In FIG. 3B, the front or back surface of a solar cell 310 includes a single busbar 312 and a number of finger lines, such as finger lines 314 and 316. FIG. 3C presents a diagram illustrating a cross-sectional view of the bifacial solar cell with a single center busbar per surface, in accordance with an embodiment of the present invention. The semiconductor multilayer structure shown in FIG. 3C can be similar to the one shown in FIG. 2. Note that the finger lines are not shown in FIG. 3C because the cut plane cuts between two finger lines. In the example shown in FIG. 3C, busbar 312 runs in and out of the paper, and the finger lines run from left to right. As discussed previously, because there is only one busbar at each surface, the distances from the edges of the fingers to the busbar are longer. However, the elimination of one busbar reduces shading, which not only compensates for the power loss caused by the increased finger-to-busbar distance, but also provides additional power gain. For a standard sized solar cell, replacing two busbars with a single busbar in the center of the cell can produce a 1.8% power gain.

Figure 3D:
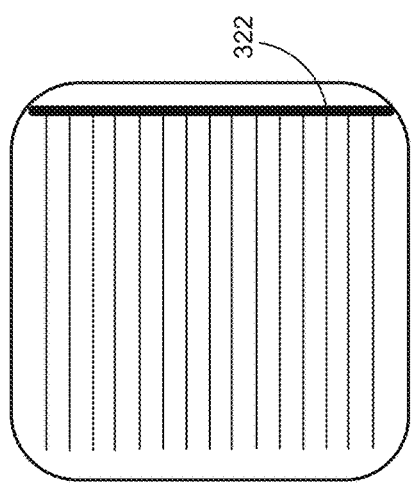
FIG. 3D presents a diagram illustrating the front surface of an exemplary bifacial solar cell, in accordance with an embodiment of the present invention.
Figure 3E:
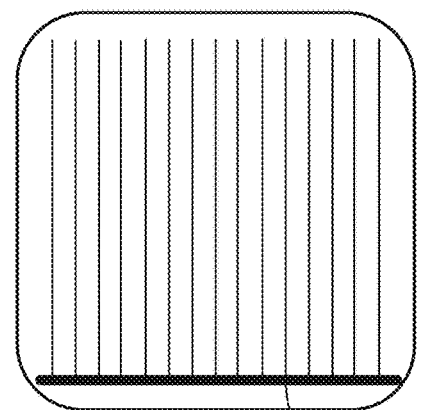
FIG. 3E presents a diagram illustrating the back surface of an exemplary bifacial solar cell, in accordance with an embodiment of the present invention.
Figure 3F:
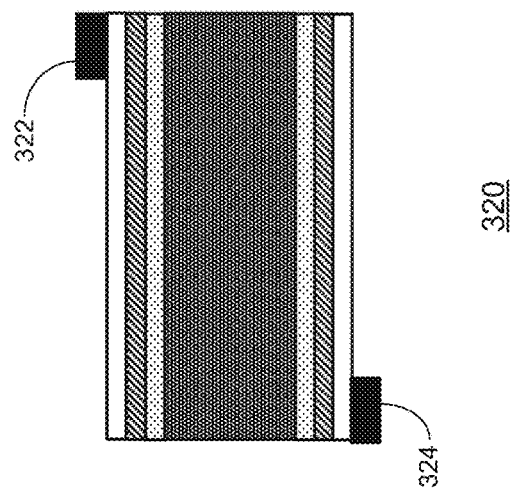
FIG. 3F presents a diagram illustrating a cross-sectional view of the bifacial solar cell with a single edge busbar per surface, in accordance with an embodiment of the present invention.

FIG. 3D presents a diagram illustrating the front surface of an exemplary bifacial solar cell, in accordance with an embodiment of the present invention. In FIG. 3D, the front surface of solar cell 320 includes a number of horizontal finger lines and a vertical single busbar 322, which is placed at the right edge of solar cell 320. More specifically, busbar 322 is in contact with the rightmost edge of all the finger lines, and collects current from all the finger lines. FIG. 3E presents a diagram illustrating the back surface of an exemplary bifacial solar cell, in accordance with an embodiment of the present invention. In FIG. 3E, the back surface of solar cell 320 includes a number of horizontal finger lines and a vertical single busbar 324, which is placed at the left edge of solar cell 320. Similar to busbar 322, single busbar 324 is in contact with the leftmost edge of all the finger lines. FIG. 3F presents a diagram illustrating a cross-sectional view of the bifacial solar cell with a single edge busbar per surface, in accordance with an embodiment of the present invention. The semiconductor multilayer structure shown in FIG. 3F can be similar to the one shown in FIG. 2. Like FIG. 3C, in FIG. 3F, the finger lines (not shown) run from left to right, and the busbars run in and out of the paper. From FIGS. 3D-3F, one can see that in this embodiment, the busbars on the front and the back surfaces of the bifacial solar cell are placed at the opposite edges of the cell. This configuration can further improve power gain because the busbar-induced shading now occurs at locations that were less effective in energy production. In general, the edge-busbar configuration can provide at least a 2.1% power gain.

Note that the single busbar per surface configurations (either the center busbar or the edge busbar) not only can provide power gain, but also can reduce fabrication cost, because less metal will be needed for busing ribbons. Moreover, in some embodiments of the present invention, the metal grid on the front sun-facing surface can include parallel metal lines (such as fingers), each having a cross-section with a curved parameter to ensure that incident sunlight on these metal lines is reflected onto the front surface of the solar cell, thus further reducing shading. Such a shade-free front electrode can be achieved by electroplating Ag- or Sn-coated Cu using a well-controlled, cost-effective patterning scheme.

Figure 4:
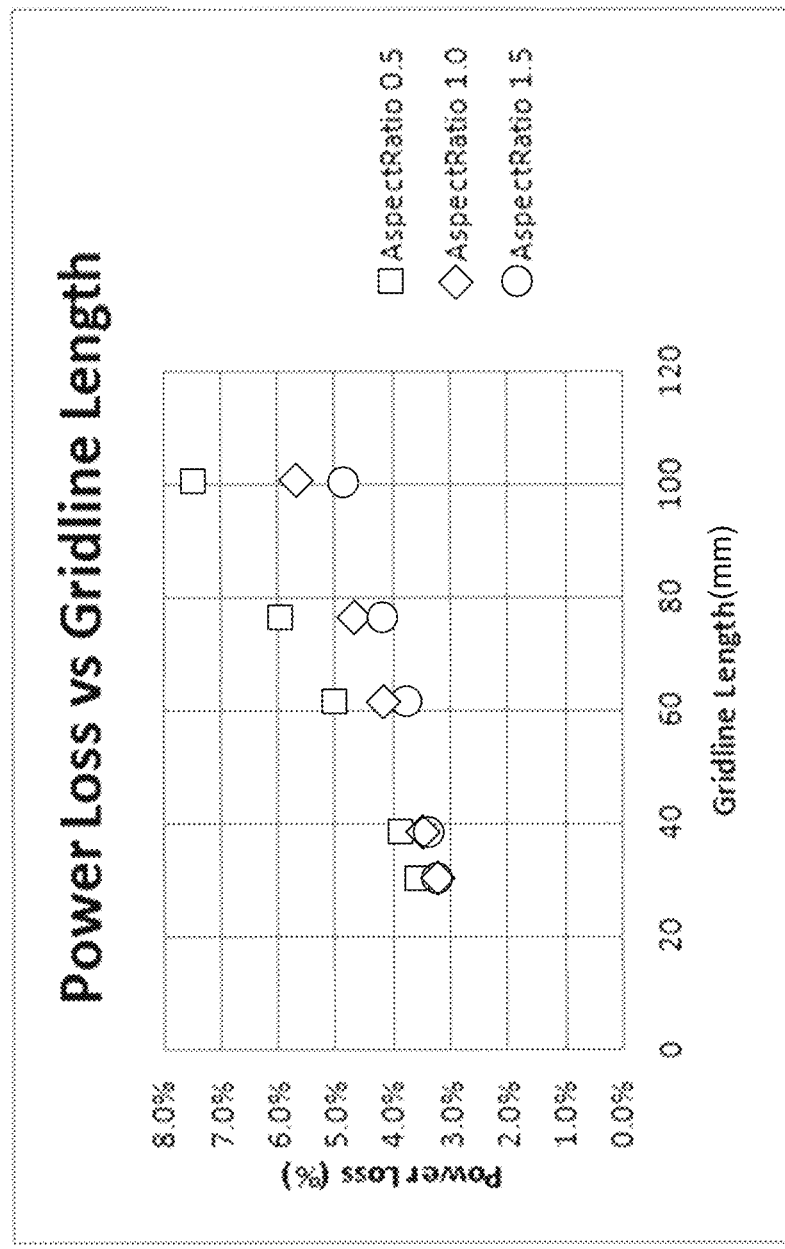
FIG. 4 presents a diagram illustrating the percentage of power loss as a function of the gridline (finger) length for different aspect ratios.

It is also possible to reduce the power-loss effect caused by the increased distance from the finger edges to the busbars by increasing the aspect ratio of the finger lines. FIG. 4 presents a diagram illustrating the percentage of power loss as a function of the gridline (finger) length for different aspect ratios. In the example shown in FIG. 4, the gridlines (or fingers) are assumed to have a width of 60 μm. As one can see from FIG. 4, for gridlines with an aspect ratio of 0.5, the power loss degrades from 3.6% to 7.5% as the gridline length increases from 30 mm to 100 mm. However, with a higher aspect ratio, such as 1.5, the power loss degrades from 3.3% to 4.9% for the same increase of gridline length. In other words, using high-aspect ratio gridlines can further improve solar cell/module performance. Such high-aspect ratio gridlines can be achieved using an electroplating technique. Details about the shade-free electrodes with high-aspect ratio can be found in U.S. patent application Ser. No. 13/048,804, entitled "Solar Cell with a Shade-Free Front Electrode," by inventors Zheng Xu, Jianming Fu, Jiunn Benjamin Heng, and Chentao Yu, filed 15 Mar. 2011, the disclosure of which is incorporated by reference in its entirety herein.

Bifacial Solar Panels

Multiple solar cells with a single busbar (either at the cell center or the cell edge) per surface can be assembled to form a solar module or panel via a typical panel fabrication process with minor modifications. Based on the locations of the busbars, different modifications to the stringing/tabbing process are needed. In conventional solar module fabrications, the double-busbar solar cells are strung together using two stringing ribbons (also called tabbing ribbons) which are soldered onto the busbars. More specifically, the stringing ribbons weave from the front surface of one cell to the back surface of the adjacent cell to connect the cells in series. For the single busbar in the cell center configuration, the stringing process is very similar, except that only one stringing ribbon is needed to weave from the front surface of one cell to the back surface of the other.

Figure 5A:
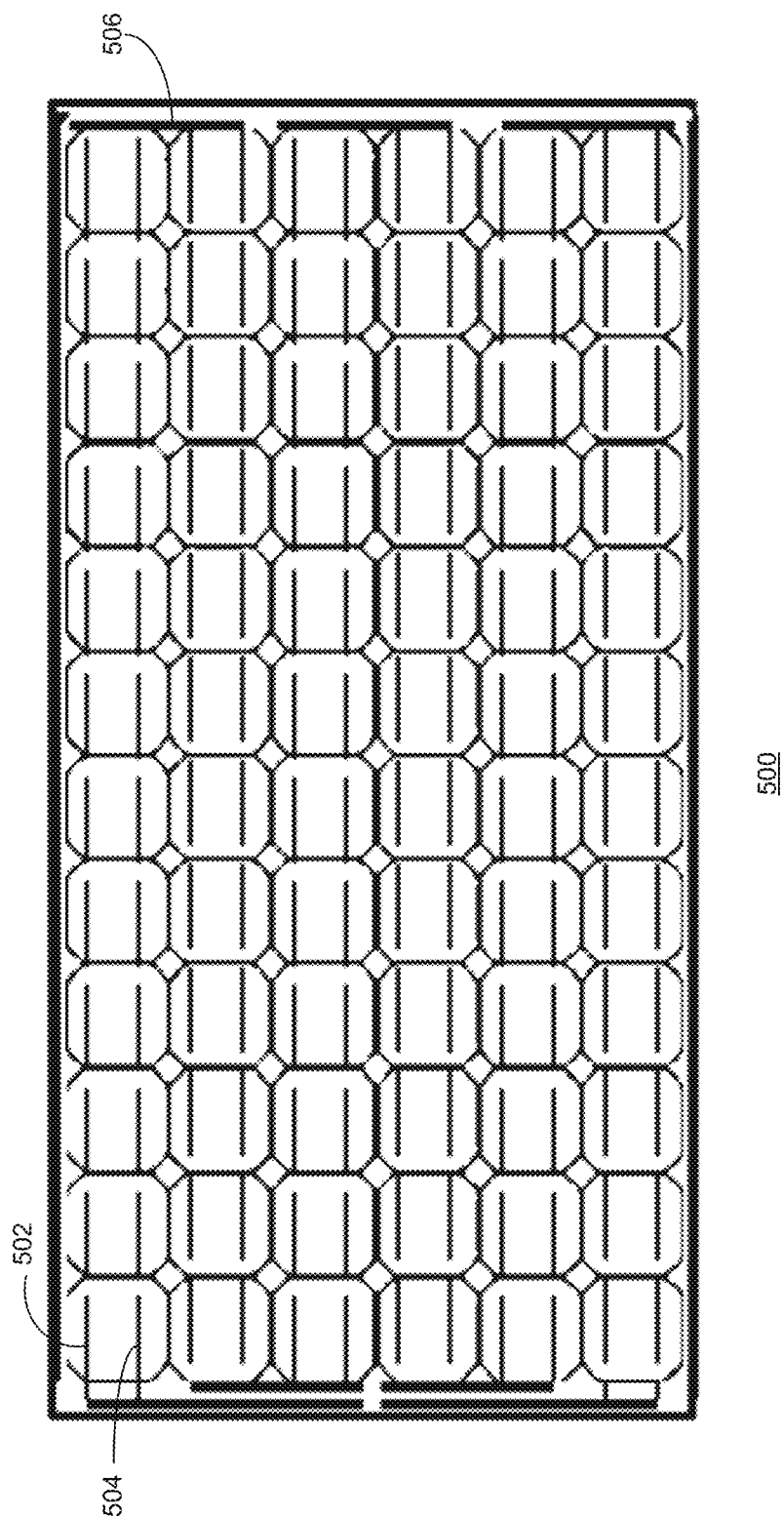
FIG. 5A presents a diagram illustrating a typical solar panel that includes a plurality of conventional double-busbar solar cells (prior art).

FIG. 5A presents a diagram illustrating a typical solar panel that includes a plurality of conventional double-busbar solar cells (prior art). In FIG. 5A, solar panel 500 includes a 6×12 array (with 6 rows and 12 cells in a row) of solar cells. Adjacent solar cells in a row are connected in series to each other via two stringing ribbons, such as a stringing ribbon 502 and a stringing ribbon 504. More specifically, the stringing ribbons connect the top electrodes of a solar cell to the bottom electrodes of the next solar cell. At the end of each row, the stringing ribbons join together with stringing ribbons from the next row by a wider bus ribbon, such as a bus ribbon 506. In the example shown in FIG. 5A, the rows are connected in series with two adjacent rows being connected to each other at one end. Alternatively, the rows can connect to each other in a parallel fashion with adjacent rows being connected to each other at both ends. Note that FIG. 5A illustrates only the top side of the solar panel; the bottom side of the solar panel can be very similar due to the bifacial characteristics of the solar cells. For simplicity, the fingers, which run perpendicular to the direction of the solar cell row (and hence the stringing ribbons), are not shown in FIG. 5A.

Figure 5B:
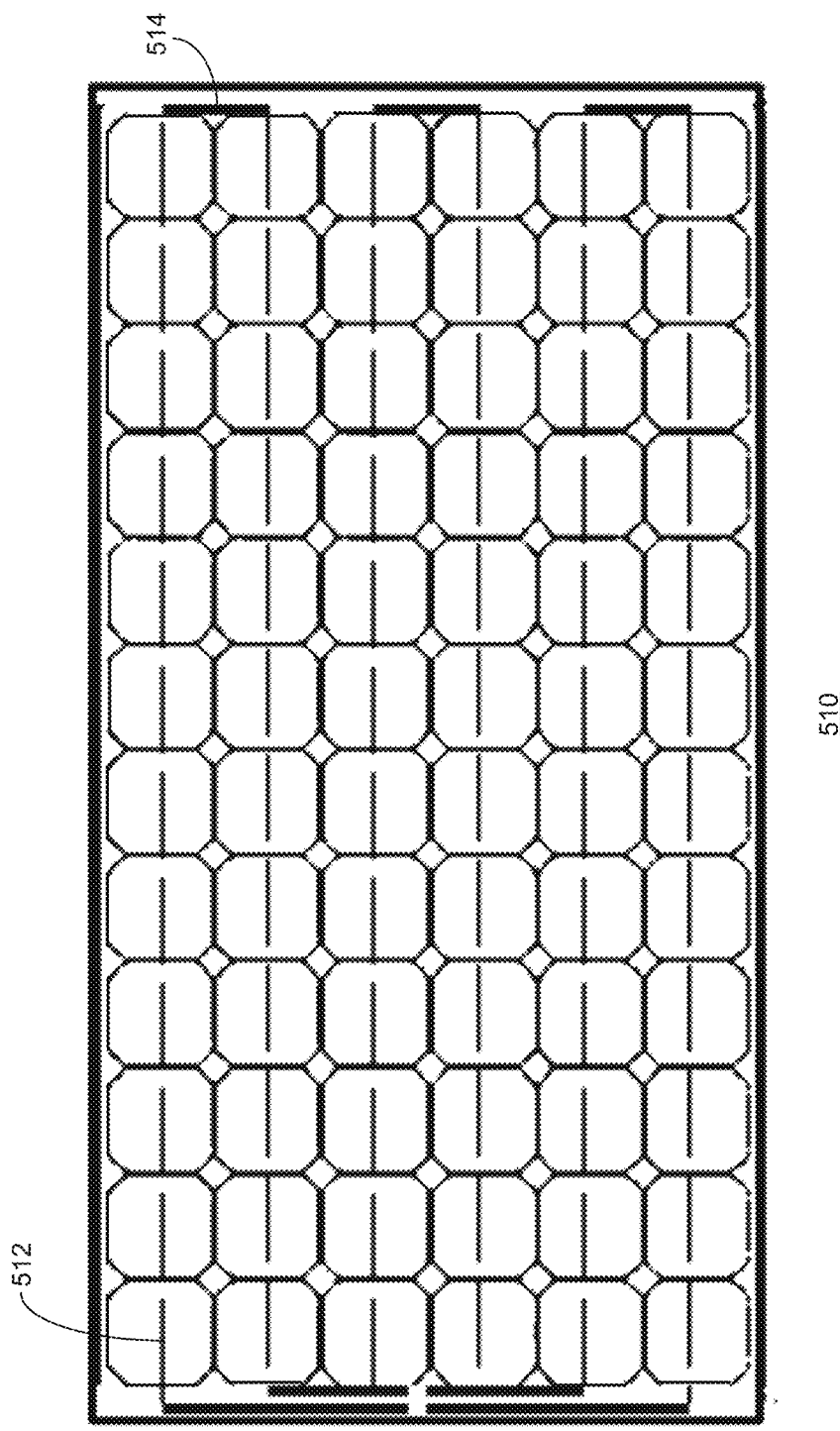
FIG. 5B presents a diagram illustrating an exemplary solar panel that includes a plurality of solar cells with a single busbar at the center, in accordance with an embodiment of the present invention.

FIG. 5B presents a diagram illustrating an exemplary solar panel that includes a plurality of solar cells with a single busbar at the center, in accordance with an embodiment of the present invention. In FIG. 5B, solar panel 510 includes a 6×12 array of solar cells. Adjacent solar cells in a row are connected in series to each other via a single stringing ribbon, such as a ribbon 512. As in solar panel 500, the single stringing ribbons at the ends of adjacent rows are joined together by a wider bus ribbon, such as a bus ribbon 514. Because only one stringing ribbon is necessary to connect adjacent cells, compared with solar panel 500 in FIG. 5A, the total length of the bus ribbon used in fabricating solar panel 510 can be significantly reduced. For six-inch cells, the length of the single stringing ribbon that connects two adjacent cells can be around 31 cm, compared with 62 cm of stringing ribbons needed for the double-busbar configuration. Note that such a length reduction can further reduce series resistance and fabrication cost. Similar to FIG. 5A, in FIG. 5B, the rows are connected in series. In practice, the solar cell rows can be connected in parallel as well. Also like FIG. 5A, the finger lines run perpendicular to the direction of the solar cell row (and hence the stringing ribbons) and are not shown in FIG. 5B.

Figure 5C:
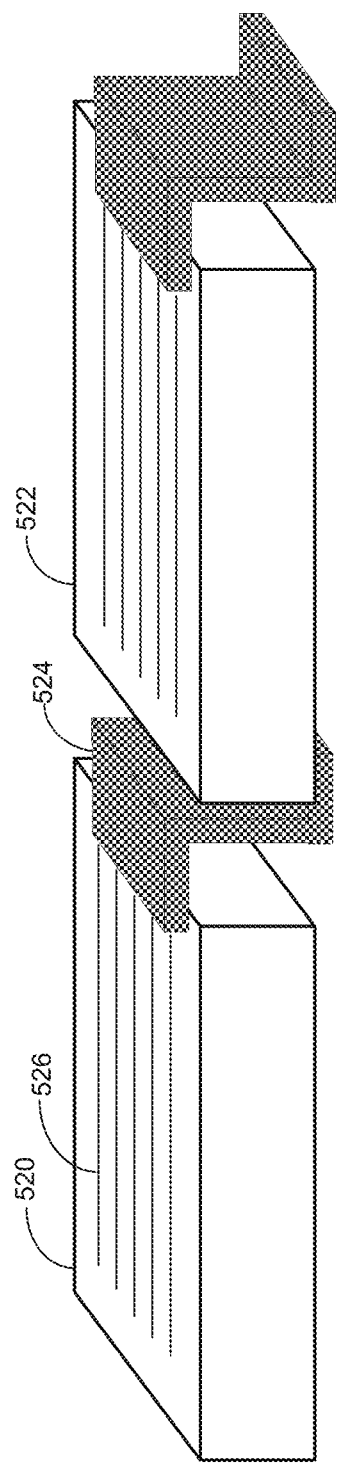
FIG. 5C presents a diagram illustrating the serial connection between two adjacent solar cells with a single edge busbar per surface, in accordance with an embodiment of the present invention.

Comparing FIG. 5B with FIG. 5A, one can see that only a minor change is needed in the stringing/tabbing process to assemble solar cells with a single center busbar into a solar panel. However, for solar cells with a single edge busbar per surface, more changes may be needed. FIG. 5C presents a diagram illustrating the serial connection between two adjacent solar cells with a single edge busbar per surface, in accordance with an embodiment of the present invention. In FIG. 5C, solar cell 520 and solar cell 522 are coupled to each other via a single tab 524. More specifically, one end of single tab 524 is soldered to the edge busbar located on the front surface of solar cell 520, and the other end of single tab 524 is soldered to the edge busbar located on the back surface of solar cell 522, thus connecting solar cells 520 and 522 in series. From FIG. 5C, one can see that the width of single tab 524 is along the length of the edge busbars (in the direction that is vertical to the finger lines) and is substantially the same as the length of the edge busbars, and the ends of single tab 524 are soldered to the edge busbars along their length. In some embodiments, the width of single tab 524 can be between 12 and 16 cm. On the other hand, the length of single tab 524 is determined by the packing density or the distance between adjacent solar cells, and can be quite short. In some embodiments, the length of single tab 524 can be between 3 and 12 mm. In further embodiments, the length of single tab 524 can be between 3 and 5 mm. This geometric configuration (a wider width and a shorter length) ensures that single tab 524 has a very low series resistance. The finger lines, such as a finger line 526, run in a direction along the length of single tab 524. Note that this is different from the conventional two-busbar configuration and the single center-busbar configuration where the fingers are perpendicular to the stringing ribbons connecting two adjacent solar cells. Hence, the conventional, standard stringing process needs to be modified by rotating each cell 90 degrees in order to string two solar cells together as shown in FIG. 5C.

Note that the edge busbar configuration works well with an edge tab going from the front edge of one solar cell to the back edge of an adjacent solar cell, when the front-side electrodes for all the cells are of the same polarity and the back-side electrodes for all the cells are all of opposite polarity. Furthermore, when the front-side electrodes of adjacent cells have different polarities (and, similarly, the back-side electrodes of adjacent cells also have different polarities), the edge tab can couple the front-side edge of one solar cell to the front-side edge of the adjacent solar cell, or the back-side edge of one solar cell to the back-side edge of the adjacent solar cell.

Figure 5D:
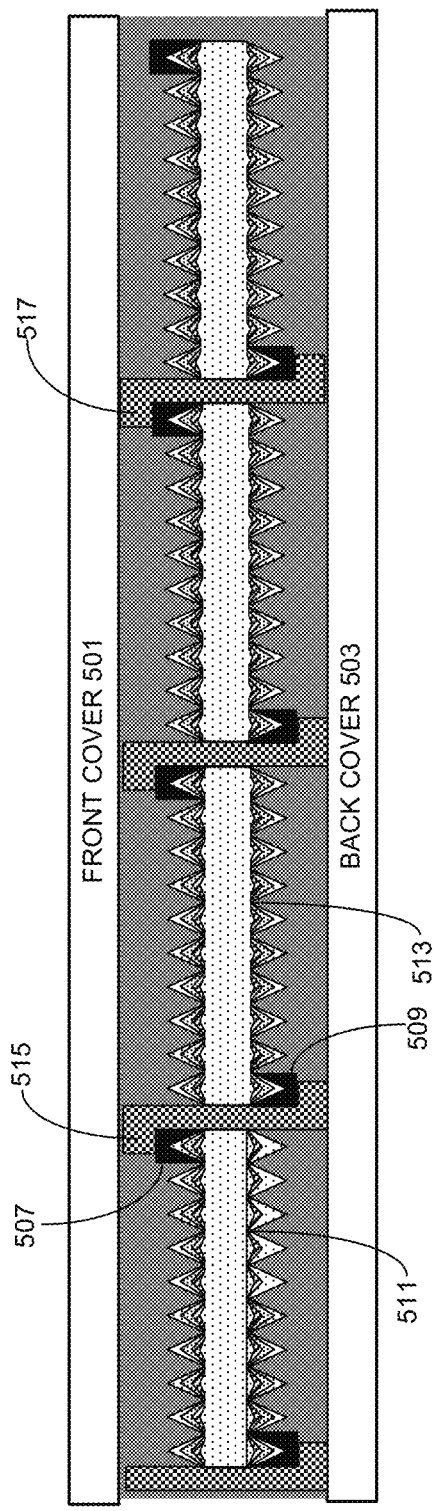
FIG. 5D presents a diagram illustrating a string of solar cells with front-side electrodes of adjacent cells having the same polarity, in accordance with an embodiment of the present invention.

Multiple solar cells can be coupled this way to form a string, and multiple strings can be coupled electrically in series or in parallel. FIG. 5D presents a diagram illustrating a string of solar cells with front-side electrodes of adjacent cells having the same polarity, in accordance with an embodiment of the present invention. In FIG. 5D, a string of solar cells (such as cells 511 and 513) are sandwiched between a front glass cover 501 and a back cover 503. More specifically, the solar cells are arranged in such a way that allows the front-side electrodes of all the cells to be of one polarity and their back-side electrodes to be of the other polarity. Metal tabs, such as tabs 515 and 517, serially couple adjacent solar cells by coupling together the front edge busbar of a solar cell and the back edge busbar of its adjacent solar cell. In the example shown in FIG. 5D, metal tab 515 couples front edge busbar 507 of solar cell 511 to back edge busbar 509 of solar cell 513.

Figure 5E:
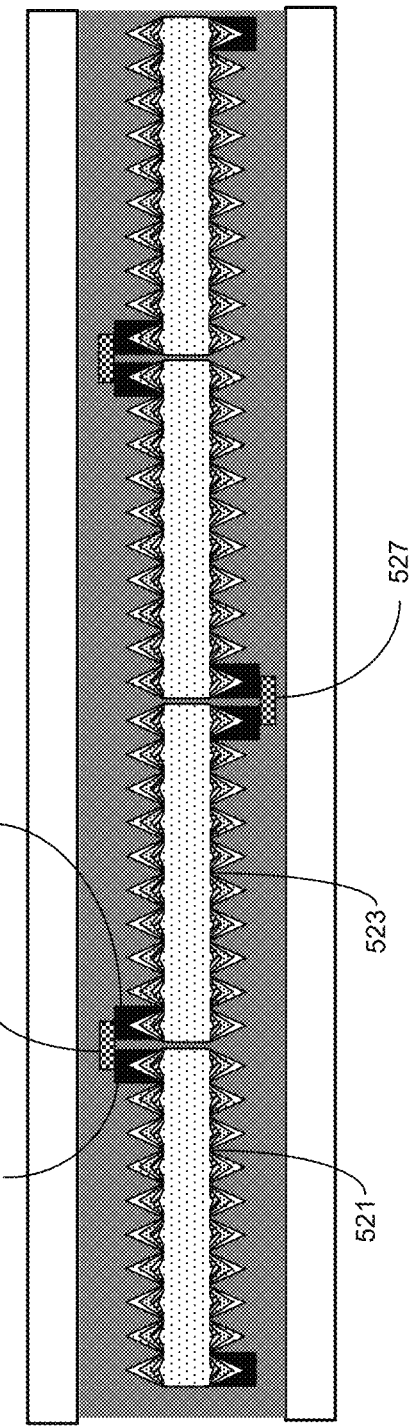
FIG. 5E presents a diagram illustrating a string of solar cells with front-side electrodes of adjacent cells having opposite polarities, in accordance with an embodiment of the present invention.

FIG. 5E presents a diagram illustrating a string of solar cells with front-side electrodes of adjacent cells having opposite polarities, in accordance with an embodiment of the present invention. In FIG. 5E, a string of solar cells (such as cells 521 and 523) are arranged in such a way that allows the front-side electrodes of adjacent cells to have alternating polarities, and similarly, the back-side electrodes of adjacent solar cells can also have alternating polarities. Metal tabs, such as tabs 525 and 527, serially couple adjacent solar cells by coupling two adjacent front edge busbars to each other, and two adjacent back edge busbars to each other. In the example shown in FIG. 5E, metal tab 525 couples front edge busbar 531 of solar cell 521 to front edge busbar 533 (which has a polarity opposite to that of edge busbar 531) of solar cell 523.

Figure 5F:
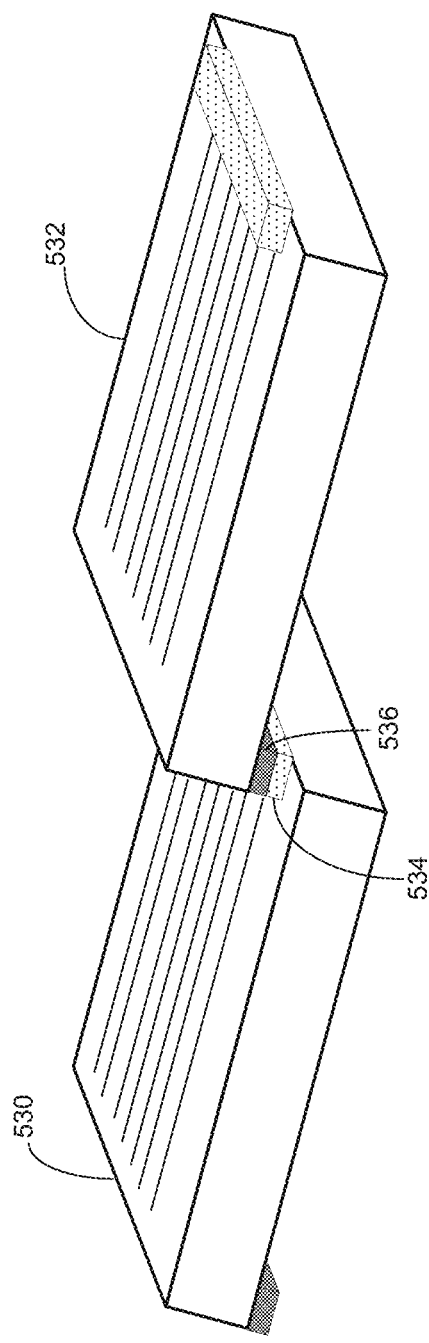
FIG. 5F presents a diagram illustrating the serial connection between two adjacent solar cells with a single edge busbar per surface, in accordance with an embodiment of the present invention.

In addition to using a single tab to serially connect two adjacent single-busbar solar cells, it is also possible to establish a serial connection between adjacent solar cells by stacking the corresponding edge busbars. FIG. 5F presents a diagram illustrating the serial connection between two adjacent solar cells with a single edge busbar per surface, in accordance with an embodiment of the present invention. In FIG. 5F, solar cell 530 and solar cell 532 are coupled via an edge busbar 534 located at the top surface of solar cell 530 and an edge busbar 536 located at the bottom surface of solar cell 532. More specifically, the bottom surface of solar cell 532 partially overlaps the top surface of solar cell 530 at the edge in such a way that bottom edge busbar 536 is placed on top of and in direct contact with top edge busbar 534. In some embodiments, edge busbars 534 and 536 may include a plated (using an electroplating or electroless plating technique) metal stack that includes multiple layers of metals, such as Ni, Cu, Sn, and Ag. Detailed descriptions of the plated metal stack can be found in U.S. patent application Ser. No. 12/835,670, entitled "Solar Cell with Metal Grid Fabricated by Electroplating," by inventors Jianming Fu, Zheng Xu, Chentao Yu, and Jiunn Benjamin Heng, filed 13 Jul. 2010; and U.S. patent application Ser. No. 13/220,532, entitled "Solar Cell with Electroplated Metal Grid," by inventors Jianming Fu, Jiunn Benjamin Heng, Zheng Xu, and Chentao Yu, filed 29 Aug. 2011, the disclosures of which are incorporated by reference in their entirety herein.

In some embodiments, the edge busbars that are in contact with each other are soldered together to enable a serial electrical connection between adjacent solar cells. In further embodiments, the soldering may happen concurrently with a lamination process, during which the edge-overlapped solar cells are placed in between a front-side cover and a back-side cover along with appropriate sealant material, which can include adhesive polymer, such as ethylene vinyl acetate (EVA). During lamination, heat and pressure are applied to cure the sealant, sealing the solar cells between the front-side and back-side covers. The same heat and pressure can result in the edge busbars that are in contact, such as edge busbars 534 and 536, being soldered together. Note that if the edge busbars include a top Sn layer, there is no need to insert additional soldering or adhesive materials between the top and bottom busbars (such as busbars 534 and 536) of adjacent solar cells. Also note that because the solar cells are five-inch or six-inch Si wafers that are relatively flexible, the pressure used during the lamination process can be relatively large without the worry that the cells may crack under such pressure. In some embodiments, the pressure applied during lamination process can be above 1.0 atmospheres, such as 1.2 atmospheres.

Figure 5G:
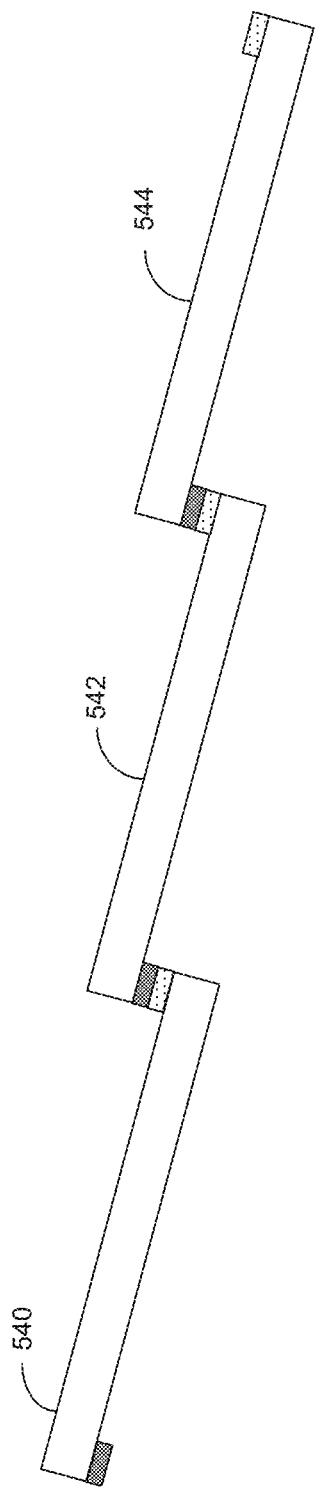
FIG. 5G presents a diagram illustrating the side-view of a string of adjacent edge-overlapped solar cells, in accordance with an embodiment of the present invention.

FIG. 5G presents a diagram illustrating the side-view of a string of adjacent edge-overlapped solar cells, in accordance with an embodiment of the present invention. In FIG. 5G, solar cell 540 partially overlaps adjacent solar cell 542, which also partially overlaps (on its opposite end) solar cell 544. Such a string of solar cells forms a pattern that is similar to roof shingles. Note that the overlapping should be kept to a minimum to minimizing shading caused by the overlapping. In some embodiments, the single busbars (both at the top and the bottom surface) are placed at the very edge of the solar cell (as shown in FIG. 5G), thus minimizing the overlapping.

Because the solar cells are bifacial (meaning that light enters from both top and bottom surfaces of the solar cells), it is desirable to have a symmetrical arrangement at the top and bottom surfaces of the solar cells. FIG. 5H presents a diagram illustrating the top-view of two adjacent edge-overlapped solar cells, in accordance with an embodiment of the present invention. In FIG. 5H, solar cells 550 and 552 partially overlap each other at the right edge of solar cell 550. The top surface (which is the surface in view) of solar cell 550 includes a number of finger lines (such as finger lines 554 and 556) that are parallel to each other and an edge busbar that is vertical to the finger lines. Note that the edge busbar is not shown in FIG. 5H because it is covered by the left edge of solar cell 552. Similarly, the top surface of solar cell 552 includes a number of finger lines (such as finger lines 558 and 560) that are parallel to each other and an edge busbar 562 that is vertical to the finger lines. FIG. 5I presents a diagram illustrating the bottom-view of two adjacent edge-overlapped solar cells, in accordance with an embodiment of the present invention. In FIG. 5I, solar cells 550 and 552 partially overlap each other at the right edge of solar cell 550. The bottom surface (which is the surface in view) of solar cell 550 includes a number of finger lines (such as finger lines 564 and 566) that are parallel to each other and an edge busbar 568 that is vertical to the finger lines. Similarly, the bottom surface of solar cell 552 includes a number of finger lines (such as finger lines 570 and 572) that are parallel to each other and an edge busbar that is vertical to the finger lines. Note that the edge busbar is not shown in FIG. 5I because it is covered by the right edge of solar cell 550. Having the same metal grid at the top and bottom surfaces of the solar cell ensures bifacial functionality.

Figure 5J:
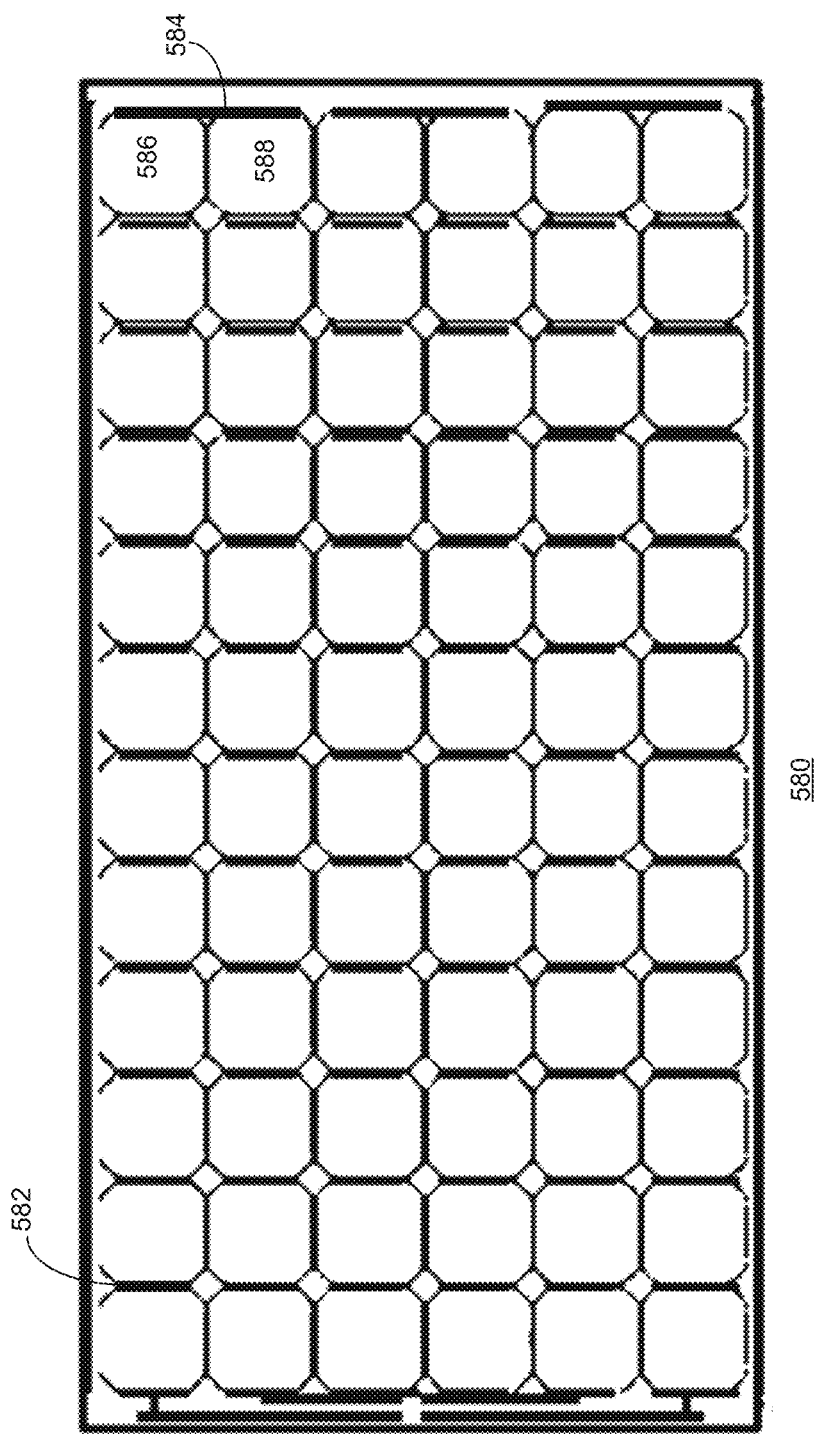
FIG. 5J presents a diagram illustrating an exemplary solar panel that includes a plurality of solar cells with a single busbar at the edge, in accordance with an embodiment of the present invention.

FIG. 5J presents a diagram illustrating an exemplary solar panel that includes a plurality of solar cells with a single busbar at the edge, in accordance with an embodiment of the present invention. In FIG. 5J, solar panel 580 includes a 6×12 array of solar cells. Solar cells in a row are connected in series to each other either via a single tab, such as a tab 582, or by edge-overlapping in a shingled pattern. At the end of the row, instead of using a wider bus ribbon to connect stringing ribbons from adjacent cells together (like the examples shown in FIGS. 5A and 5B), here we simply use a tab that is sufficiently wide to extend through edges of both end cells of the adjacent rows. For example, an extra-wide tab 584 extends through edges of cells 586 and 588. For serial connection, extra-wide tab 584 can connect the busbar at the top surface of cell 586 with the busbar at the bottom surface of cell 588, which means solar cells 586 and 588 are placed in such a way that the top edge busbar of cell 586 aligns with the bottom edge busbar of cell 588. Note that if the solar cells in a row are placed in a shingled pattern, the adjacent rows may have opposite shingle patterns, such as right-side on top or left-side on top. For parallel connection, extra-wide tab 584 may connect both the top/bottom busbars of cells 586 and 588. If the solar cells in a row are shingled, the shingle pattern of all rows remains the same. Unlike examples shown in FIGS. 5A and 5B, in FIG. 5I, the finger lines (not shown) run along the direction of the solar cell rows.

The stringing ribbons or tabs can also introduce power loss due to their series resistance. In general, the distributed power loss through series resistance of the stringing ribbons increases with the size of the cell. Moreover, using single stringing ribbon instead of two ribbons also increases this series-resistance-induced power loss because the single-ribbon configuration means that there is more current on each ribbon, and the power loss is proportional to the square of the current. To reduce such a power loss, one needs to reduce the series resistance of the stringing ribbon. For the single center-busbar configuration, the width of the ribbon is determined by the width of the busbar, which can be between 0.5 and 3 mm. Hence, one way to reduce the resistance of the ribbon is to increase its thickness as thicker ribbons have lower resistivity. FIG. 6A presents a diagram illustrating the percentages of the ribbon-resistance-based power loss for the double busbar (DBB) and the single busbar (SBB) configurations for different types of cells, different ribbon thicknesses, and different panel configurations. In the example shown in FIG. 6A, the ribbons are assumed to be Cu ribbons.

From FIG. 6A, one can see that for 200 µm thick ribbons, the ribbon-resistance-induced power loss for a five-inch cell with a single busbar (SBB) (at the center) configuration is 2.34%, compared to the 1.3% power loss of the double busbar (DBB) configuration. To limit the power loss to less than 2% in order to take advantage of the 1.8% power gain obtained from the reduced shading by eliminating one busbar, the thickness of the single stringing ribbon needs to be at least 250 µm. For larger cells, such as a six-inch cell, the situation can be worse. For the single center-busbar configuration, ribbons with a thickness of 400 um are needed to ensure less than 3% power loss in the six-inch cell, as indicated by cells 602 and 604. Note that the number of cells in a panel also affects the amount of power loss.

400 um is the upper boundary for the ribbon thickness because thicker ribbons can cause damage to the cells during the soldering process. More specifically, thicker ribbons may result in warping of the cells, which can be caused by stress and the thermal-coefficient difference between the ribbon material and the semiconductor material. Moreover, reliability concerns also start to surface if the stringing ribbons are too thick. Implementation of ultrasoft ribbons can reduce the stress and warping issues, but a different stringing scheme is required to effectively reduce the power loss to less than 2% without giving up the gains made by busbar shading reduction and ribbon cost reduction. In some embodiments, other methods are used to reduce stress and warping, including but not limited to: introducing crimps or springs within the length of the stringing ribbon, and spot soldering of the thick ribbon.

For the single-edge-busbar configuration, because the tabs are much wider and shorter than the stringing ribbon, the amount of power loss induced by the series resistance of the single tab is much smaller. FIG. 6B presents a diagram comparing the power loss difference between the stringing ribbons and the single tab for different ribbon/tab thicknesses. From FIG. 6B, one can see that the power loss due to the series resistance of the single tab is much smaller compared with that of the single ribbon, as indicated by column 606. For example, the power loss caused by the 250 um thick single edge tab is merely 0.73% for five-inch, 96-cell panel layout, and around 1.64% for six-inch, 60-cell panel layout. Hence, one can see that, even for the six-inch cell in the 72-cell panel, an edge tab with a thickness of 250 um is sufficiently thick that it induces less than a 2% power loss, making it possible to achieve an overall power gain considering the reduction in shading.

One more factor that can affect power output of the solar panel is the mismatch among cells, which may be caused by a partially shaded solar panel. To maximize power output, it is possible to incorporate maximum power point tracking (MPPT) devices into a solar panel to allow a partially shaded or otherwise obscured panel to deliver the maximum power to the battery charging system coupled to the panel. The MPPT device can manage power output of a string of cells or a single cell. In some embodiments of the present invention, the solar panel implements cell-level MPPT, meaning that each solar cell is coupled to an MPPT device, such as an MPPT integrated circuit (IC) chip.

Implementing MPPT at the cell level makes it possible to recoup up to 30% of the power that can be lost due to the mismatch inefficiencies. Moreover, it eliminates cell binning requirements and may increase yield. This can thus significantly enhance the return of investment (ROI) for the array owners by eliminating the inventory management needs of installers to match panels within a string, as well as reducing warranty reserves because replacement panels no longer need to be matched to the old system. Cell-level MPPT can also increase the available surface area for the installation of a solar array, particularly in situations where there may be structural shading of the array at certain hours of the day or during certain seasons of the year. This is particularly useful to bifacial modules which may experience shading at both the front- and back-side. The cell-level MPPT also allows more flexibility in the system mounting, making it possible to use 1- or 2-axis trackers, and ground mounting on high diffuse light background. Details about the cell-level MPPT can be found in U.S. patent application Ser. No. 13/252,987, entitled "Solar Panels with Integrated Cell-Level MPPT Devices," by inventors Christopher James Beitel, Jiunn Benjamin Heng, Jianming Fu, and Zheng Xu, filed 4 Oct. 2011, the disclosure of which is incorporated by reference in its entirety herein. In further embodiments, the solar module can have one MPPT device per string of solar cells, thereby facilitating string-level MPPT.

Figure 7A:
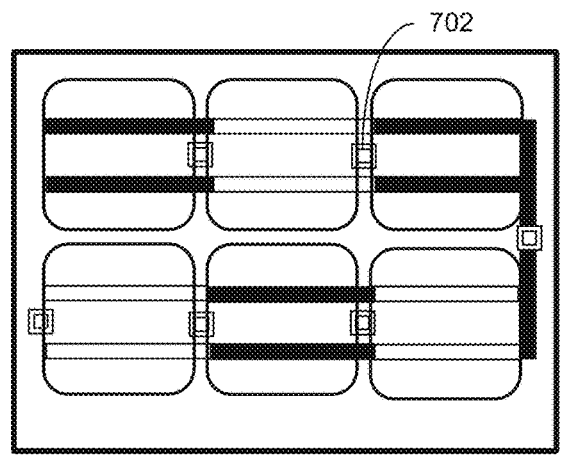
FIG. 7A presents a diagram illustrating one exemplary placement of maximum power point tracking (MPPT) integrated circuit (IC) chips in a solar panel with double-busbar solar cells, in accordance with an embodiment of the present invention.

FIG. 7A presents a diagram illustrating one exemplary placement of maximum power point tracking (MPPT) integrated circuit (IC) chips in a solar panel with double-busbar solar cells, in accordance with an embodiment of the present invention. In the example shown in FIG. 7A, the MPPT IC chips, such as an MPPT IC chip 702, are placed between adjacent solar cells. More specifically, the MPPT IC chips can be placed between the two stringing ribbons. In some embodiments, the MPPT IC chips can make contact with both stringing ribbons and facilitate the serial connection between two adjacent solar cells.

Figure 7B:
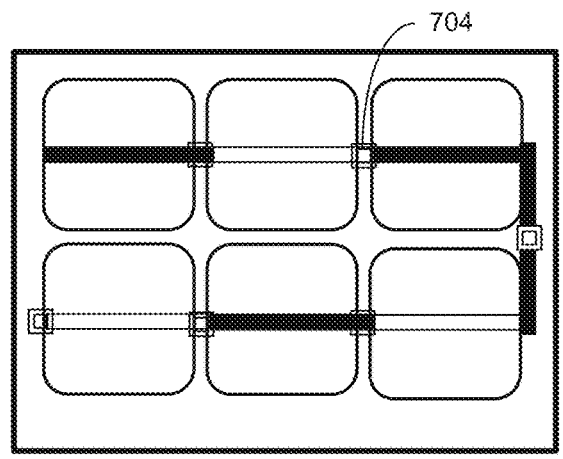
FIG. 7B presents a diagram illustrating one exemplary placement of maximum power point tracking (MPPT) integrated circuit (IC) chips in a solar panel with single-center-busbar solar cells, in accordance with an embodiment of the present invention.

FIG. 7B presents a diagram illustrating one exemplary placement of maximum power point tracking (MPPT) integrated circuit (IC) chips in a solar panel with single-center-busbar solar cells, in accordance with an embodiment of the present invention. Like the example shown in FIG. 7A, the MPPT IC chips, such as an MPPT IC chip 704, are placed between two adjacent solar cells. In some embodiments, the MPPT IC chips are three-terminal devices with two inputs from one cell and one output to the adjacent cell. The two inputs can be connected to the top and bottom electrodes (via corresponding stringing ribbons) of the first solar cell, and the one output can be connected to the top or bottom electrode of the adjacent solar cell to facilitate the serial connection between the two cells.

Figure 7C:
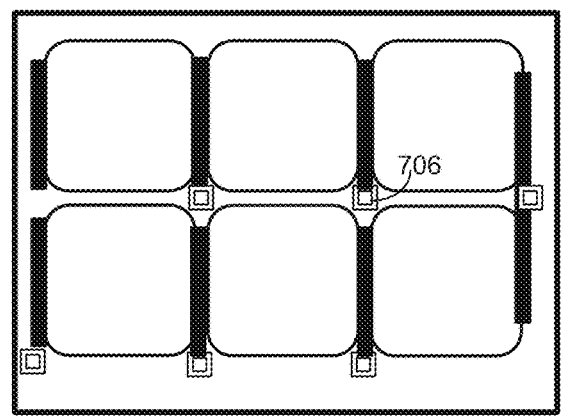
FIG. 7C presents a diagram illustrating one exemplary placement of maximum power point tracking (MPPT) integrated circuit (IC) chips in a solar panel with single-edge-busbar solar cells, in accordance with an embodiment of the present invention.

In addition to placing the MPPT IC chips in between adjacent solar cells, it is also possible to place the MPPT IC chips at the corner spacing between solar cells. FIG. 7C presents a diagram illustrating one exemplary placement of maximum power point tracking (MPPT) integrated circuit (IC) chips in a solar panel with single-edge-busbar solar cells, in accordance with an embodiment of the present invention. In the example shown in FIG. 7C, the MPPT IC chips, such as an MPPT IC chip 706, are placed at the corner spacing between solar cells. In some embodiments, the MPPT IC chips are in contact with the single tabs to facilitate the serial connection between the two adjacent chips. Note that for the single-edge-busbar configuration, wiring outside of the solar cell may be needed to connect the front and back electrodes located on opposite sides of the solar cell with the two inputs of the MPPT chip.

Figure 7D:
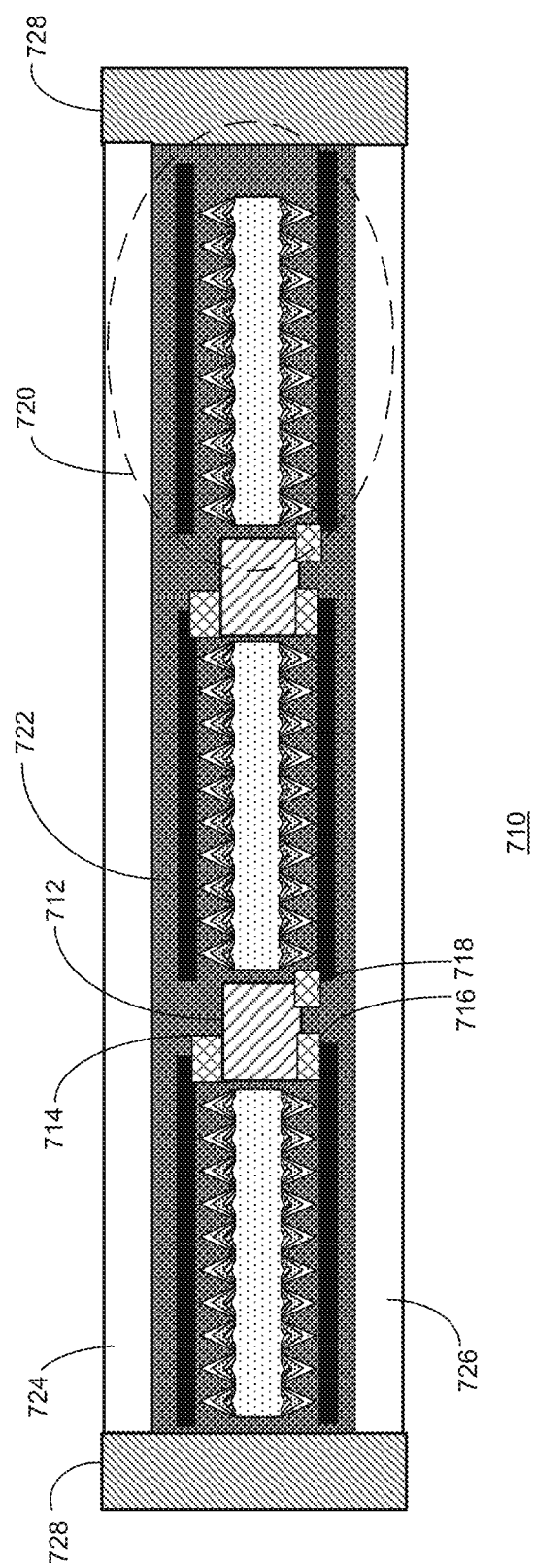
FIG. 7D presents a diagram illustrating the cross-sectional view of an exemplary solar module implementing cell-level MPPT, in accordance with an embodiment of the present invention.

FIG. 7D presents a diagram illustrating the cross-sectional view of an exemplary solar module implementing cell-level MPPT, in accordance with an embodiment of the present invention. In FIG. 7D, each solar cell in solar module 710 includes a top electrode and a bottom electrode, which can be the single center busbars shown in FIG. 7B. Each MPPT IC chip includes a top input terminal, a bottom input terminal, and a bottom output terminal. For example, MPPT IC chip 712 includes a top input terminal 714, a bottom input terminal 716, and an output terminal 718. Top input terminal 714 and bottom input terminal 716 are coupled to top and bottom electrodes of a solar cell. Output terminal 718 is coupled to the bottom electrode of the adjacent solar cell. In the example shown in FIG. 7D, the solar cells, such as a solar cell 720, can be double-sided tunneling junction solar cells.

The solar cells and the MPPT IC chips are embedded within an adhesive polymer layer 722, which can later be cured. Materials that can be used to form adhesive polymer layer 722 include, but are not limited to: ethylene-vinyl acetate (EVA), acrylic, polycarbonate, polyolefin, and thermal plastic. Solar module 710 further includes a front-side cover 724 and a back-side cover 726. For bifacial modules, both front-side cover 724 and back-side cover 726 can be made of glass. When adhesive polymer layer 722 is cured, front- and back-side covers 724 and 726 are laminated, sealing the solar cells and the MPPT IC chips within, thus preventing damage caused by exposure to environmental factors. After lamination, solar module 710 can be trimmed and placed in a frame 728, and is then ready to be connected to an appropriate junction box.

Figure 8:
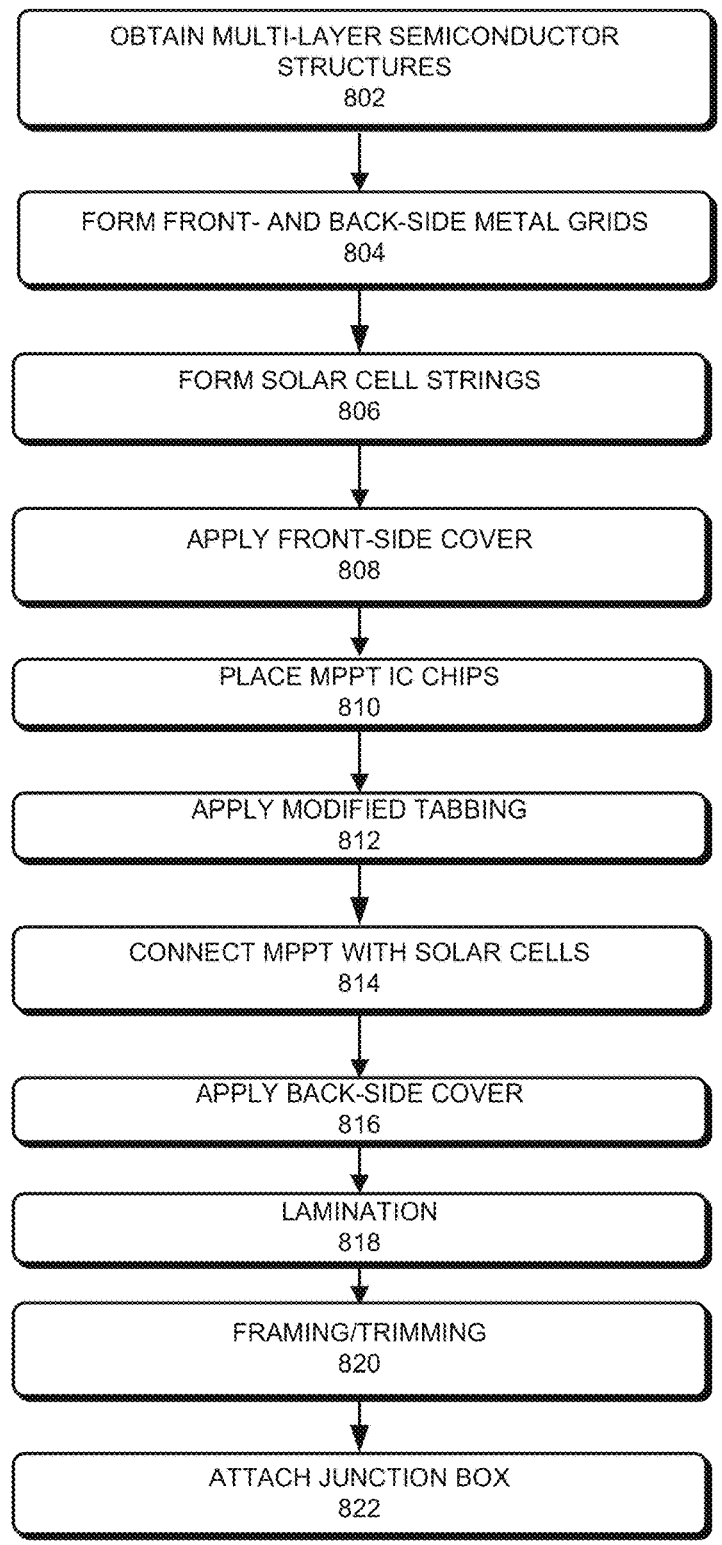
FIG. 8 presents a flow chart illustrating the process of fabricating a solar cell module, in accordance with an embodiment of the present invention.

FIG. 8 presents a flow chart illustrating the process of fabricating a solar cell module, in accordance with an embodiment of the present invention. During fabrication, solar cells comprising multi-layer semiconductor structures are obtained (operation 802). In some embodiments, the multi-layer semiconductor structure can include a double-sided tunneling junction solar cell. The solar cells can have a standard size, such as five inch by five inch or six inch by six inch. In some embodiments, the smallest dimension of the solar cells is at least five inches. Front- and back-side metal grids are then deposited to complete the bifacial solar cell fabrication (operation 804). In some embodiments, depositing the front- and back-side metal grids may include electroplating of Ag- or Sn-coated Cu grid. In further embodiments, one or more seed metal layers, such as a seed Cu or Ni layer, can be deposited onto the multi-layer structures using a physical vapor deposition (PVD) technique to improve adhesion of the electroplated Cu layer. Different types of metal grids can be formed, including, but not limited to: a metal grid with a single busbar at the center, and a metal grid with a single busbar at the cell edge. Note that for the edge-busbar configuration, the busbars at the front and back surface of the solar cells are placed at opposite edges.

Subsequently, the solar cells are strung together to form solar cell strings (operation 806). Note that, depending on the busbar configuration, the conventional stringing process may need to be modified. For the edge-busbar configuration, each solar cell needs to be rotated 90 degrees, and a single tab that is as wide as the cell edge and is between 3 and 12 mm in length can be used to connect two adjacent solar cells. In some embodiments, the length of the single tab can be between 3 and 5 mm.

A plurality of solar cell strings can then be laid out into an array and the front-side cover can be applied to the solar cell array (operation 808). For solar modules implementing cell-level MPPT, the MPPT IC chips are placed at appropriate locations, including, but not limited to: corner spacing between solar cells, and locations between adjacent solar cells (operation 810). The different rows of solar cells are then connected to each other via a modified tabbing process (operation 812), and then electrical connections between the MPPT IC chips and corresponding solar cell electrodes are formed to achieve a completely interconnected solar module (operation 814). More specifically, the top electrode of a solar cell is connected to one terminal of the IC and the bottom electrode is tied to another terminal of the IC via typical semiconducting methods, including, but not limited to: solder bumps, flip chip, wrap through contacts, etc. Subsequently, the back-side cover is applied (operation 816), and the entire solar module assembly can go through the normal lamination process, which would seal the cells and MPPT ICs in place (operation 818), followed by framing and trimming (operation 820), and the attachment of a junction box (operation 822).

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar module, comprising:
a first solar cell having a first back-side emitter layer, and having only an area along one edge on a back-side surface covered by a first busbar; and
a second solar cell having only an area along one edge on a front-side surface covered by a second busbar;
wherein the first solar cell and second solar cell are coupled by overlapping the first busbar and second busbar.

2. The solar module of claim 1, wherein the first solar cell has a front surface-field layer.

3. The solar module of claim 1, wherein each of the first and second solar cells has a set of finger lines on a respective surface and coupled to the corresponding busbar.

4. The solar module of claim 1, a respective busbar of each of the first and second solar cells comprises plated Cu.

5. The solar module of claim 1, wherein the first and second busbars are soldered together.

6. The solar module of claim 1, wherein each of the first and second solar cells is a bi-facial solar cell.

7. The solar module of claim 1, further comprising a front-side cover and back-side cover, wherein the first and second solar cells are positions between the front-side and back-side covers.

8. The solar module of claim 7, wherein the first and second solar cells are laminated with a sealant material between the front-side and back-side covers.

9. The solar module of claim 1, further comprising additional solar cells, wherein two adjacent solar cells are coupled together by overlapping edges of the two adjacent solar cells, wherein the two adjacent solar cells are overlapped in such a way that a front-side edge busbar of one respective solar cell is coupled to a back-side edge busbar of an adjacent solar cell, thereby facilitating a serial connection between the two adjacent solar cells.

10. The solar module of claim 9, wherein a plurality of solar cells are coupled by overlapping edges to form a string, and wherein a plurality of strings are coupled electrically in series or in parallel.

11. The solar module of claim 1, wherein each of the first and second solar cells has a multi-layer semiconductor structure that includes a quantum tunneling barrier layer.

12. The solar module of claim 1, wherein a width of a respective busbar is between 0.5 and 3 mm.

13. The solar module of claim 1, further comprising a plurality of maximum power point tracking (MPPT) devices, wherein a respective MPPT device is coupled to an individual solar cell, thereby facilitating cell-level MPPT.

14. The solar module of claim 1, further comprising a plurality of MPPT devices, wherein a respective MPPT device is coupled to a string of solar cells, thereby facilitating string-level MPPT.

15. The solar module of claim 1, further comprising transparent front-side and the back-side covers, thereby facilitating bifacial operation of the solar module.

16. A solar cell coupling system, comprising:
a first solar cell and a second solar cell, wherein a respective solar cell comprises a back-side emitter layer, a front-side electrode, and a back-side electrode, and wherein a respective electrode comprises a busbar;
wherein the first solar cell's back-side surface has only an area along one edge covered by a first busbar;
wherein the second solar cell's front-side surface has only an area along one edge covered by a second busbar; and
wherein the first busbar and second busbar are overlapped and in physical contact, thereby facilitating coupling between the first and second solar cells.

17. The solar cell coupling system of claim 16, wherein each electrode comprises a set of finger lines; and
a respective busbar comprises plated Cu.

18. A solar cell coupling system, comprising:
a first busbar positioned on a back-side surface of a first solar cell; and
a second busbar positioned on a front-side surface of a second solar cell;
wherein the first busbar and second busbar are physically attached to each other in an overlapping manner;
wherein the first solar cell has only an area along one edge on the back-side surface covered by the first busbar;
wherein the second solar cell has only an area along one edge on the front-side surface covered by the second busbar; and wherein each of the first and second solar cells has a back-side emitter layer.

19. The solar cell coupling system of claim 18, further comprising:
a layer of soldering material between the first and second busbars.

20. The solar cell coupling system of claim 18, wherein each of the first and second busbars comprises plated Cu.

* * * * *